US011282942B2

(12) United States Patent
Kao et al.

(10) Patent No.: US 11,282,942 B2
(45) Date of Patent: Mar. 22, 2022

(54) SEMICONDUCTOR DEVICE STRUCTURE WITH UNIFORM THRESHOLD VOLTAGE DISTRIBUTION AND METHOD OF FORMING THE SAME

(71) Applicant: Taiwan Semiconductor Manufacturing Co., Ltd., Hsin-Chu (TW)

(72) Inventors: Wei-Chih Kao, Hsinchu (TW); Hsin-Che Chiang, Hsinchu (TW); Yu-San Chien, Hsinchu (TW); Chun-Sheng Liang, Changhua County (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/925,703

(22) Filed: Jul. 10, 2020

(65) Prior Publication Data

US 2021/0066476 A1 Mar. 4, 2021

Related U.S. Application Data

(60) Provisional application No. 62/893,853, filed on Aug. 30, 2019.

(51) Int. Cl.
*H01L 29/66* (2006.01)
*H01L 27/092* (2006.01)
(Continued)

(52) U.S. Cl.
CPC .... *H01L 29/66795* (2013.01); *H01L 21/0337* (2013.01); *H01L 21/324* (2013.01);
(Continued)

(58) Field of Classification Search
CPC . H01L 21/0337; H01L 21/324; H01L 21/762; H01L 21/76832; H01L 21/823807; H01L 21/823821; H01L 21/823828; H01L 21/823878; H01L 27/0922; H01L 27/0886; H01L 29/0649; H01L 29/66545; H01L 29/785; H01L 29/66795
USPC ............... 438/514, 197, 283, 301, 302, 343; 257/368, 369, 401, 607, 288, 347, 257/E21.473, E21.144, E21.409, E21.41,
(Continued)

(56) References Cited

U.S. PATENT DOCUMENTS 8,629,477 B2 1/2014 Lochtefeld et al.
8,796,666 B1 8/2014 Huang et al.
(Continued)

*Primary Examiner* — Dao H Nguyen
(74) *Attorney, Agent, or Firm* — Haynes and Boone, LLP

(57) ABSTRACT

An embodiment method includes: forming a semiconductor liner layer on exposed surfaces of a fin structure that extends above a dielectric isolation structure disposed over a substrate; forming a first capping layer to laterally surround a bottom portion of the semiconductor liner layer; forming a second capping layer over an upper portion of the semiconductor liner layer; and annealing the fin structure having the semiconductor liner layer, the first capping layer, and the second capping layer thereon, the annealing driving a dopant from the semiconductor liner layer into the fin structure, wherein a dopant concentration profile in a bottom portion of the fin structure is different from a dopant concentration profile in an upper portion of the fin structure.

20 Claims, 24 Drawing Sheets

(51) Int. Cl.
*H01L 21/8238* (2006.01)
*H01L 21/033* (2006.01)
*H01L 29/78* (2006.01)
*H01L 29/06* (2006.01)
*H01L 21/762* (2006.01)
*H01L 21/324* (2006.01)
*H01L 21/768* (2006.01)

(52) U.S. Cl.
CPC ...... *H01L 21/762* (2013.01); *H01L 21/76832* (2013.01); *H01L 21/823807* (2013.01); *H01L 21/823821* (2013.01); *H01L 21/823828* (2013.01); *H01L 21/823878* (2013.01); *H01L 27/0922* (2013.01); *H01L 29/0649* (2013.01); *H01L 29/66545* (2013.01); *H01L 29/785* (2013.01)

(58) Field of Classification Search
USPC .. 257/E21.439, E21.703, E27.112, E27.015, 257/E27.06, E27.062, E29.109, E29.193, 257/E29.255, E29.262
See application file for complete search history.

(56) References Cited

U.S. PATENT DOCUMENTS

| | | |
|---|---|---|
| 8,815,712 B2 | 8/2014 | Wan et al. |
| 8,963,258 B2 | 2/2015 | Yu et al. |
| 9,093,530 B2* | 7/2015 | Huang .............. H01L 21/30604 |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0270641 A1* | 10/2013 | Chi .................. H01L 29/66818 257/351 |
| 2015/0380249 A1* | 12/2015 | Gouk ................ H01L 29/66803 438/559 |
| 2019/0097024 A1* | 3/2019 | Li ........................ H01L 21/265 |
| 2020/0135584 A1* | 4/2020 | Wang .............. H01L 21/823878 |
| 2021/0111272 A1* | 4/2021 | Wu ................ H01L 21/823431 |

* cited by examiner

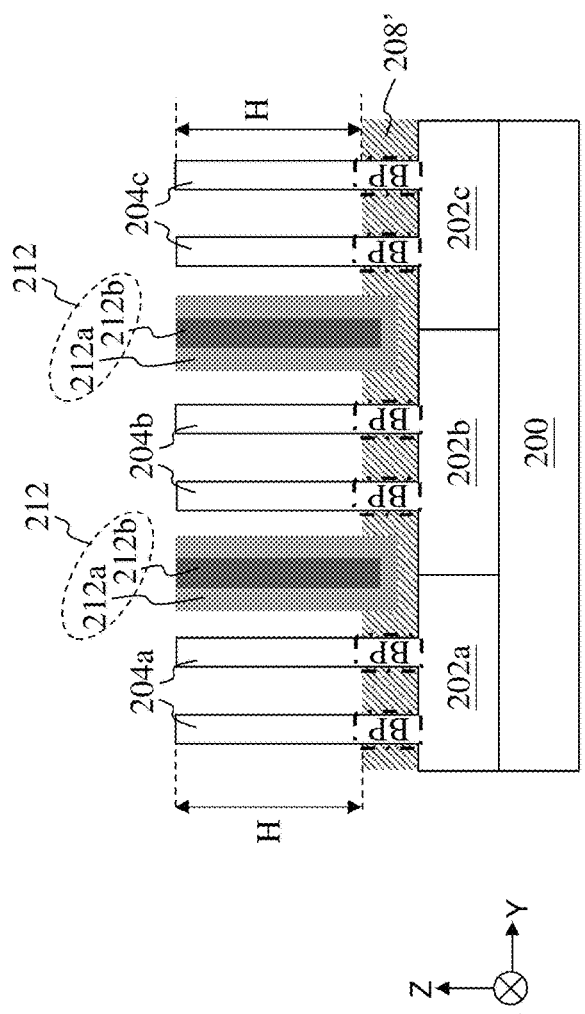
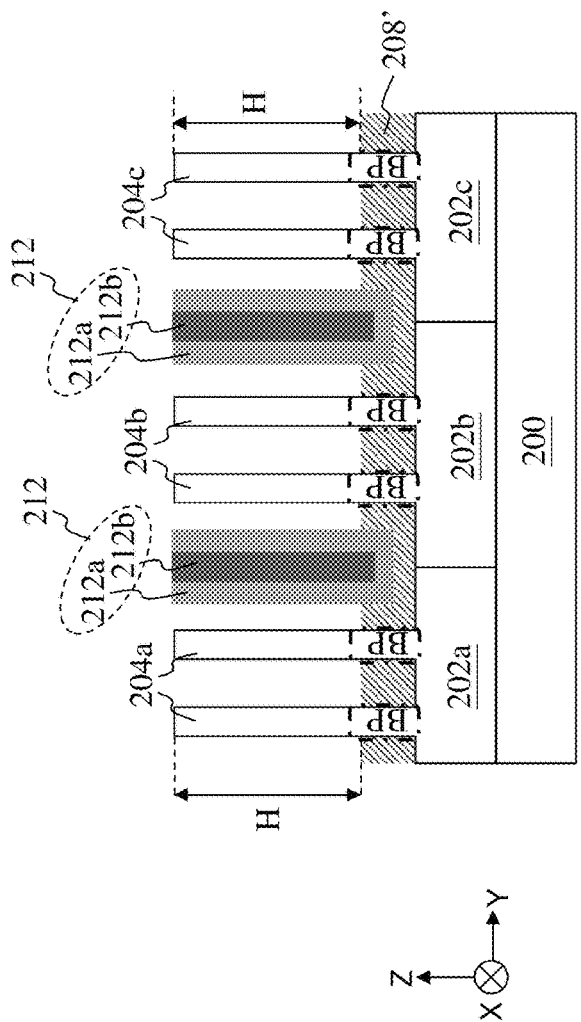
FIGURE 7A
FIGURE 7B

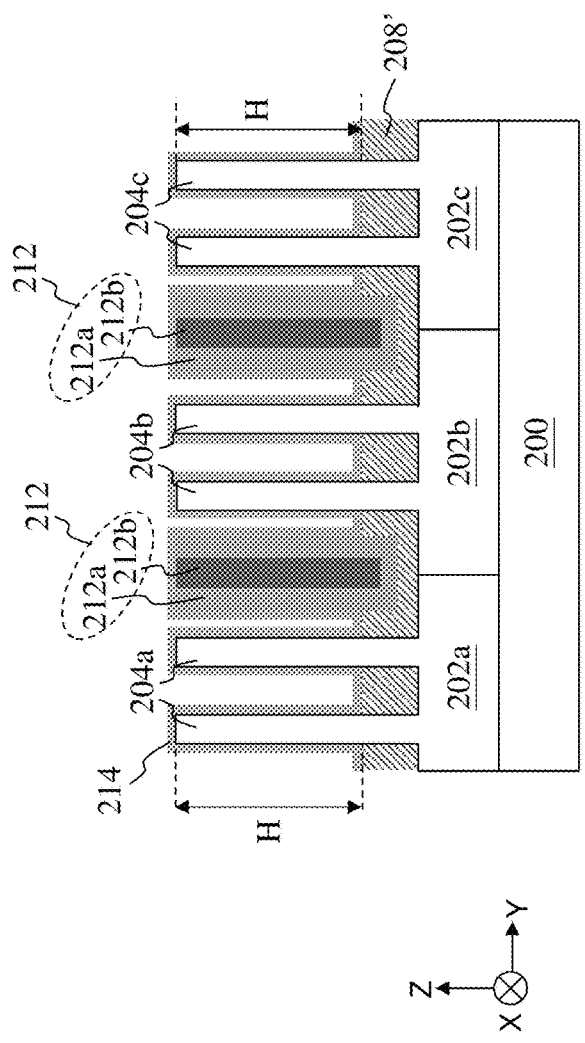
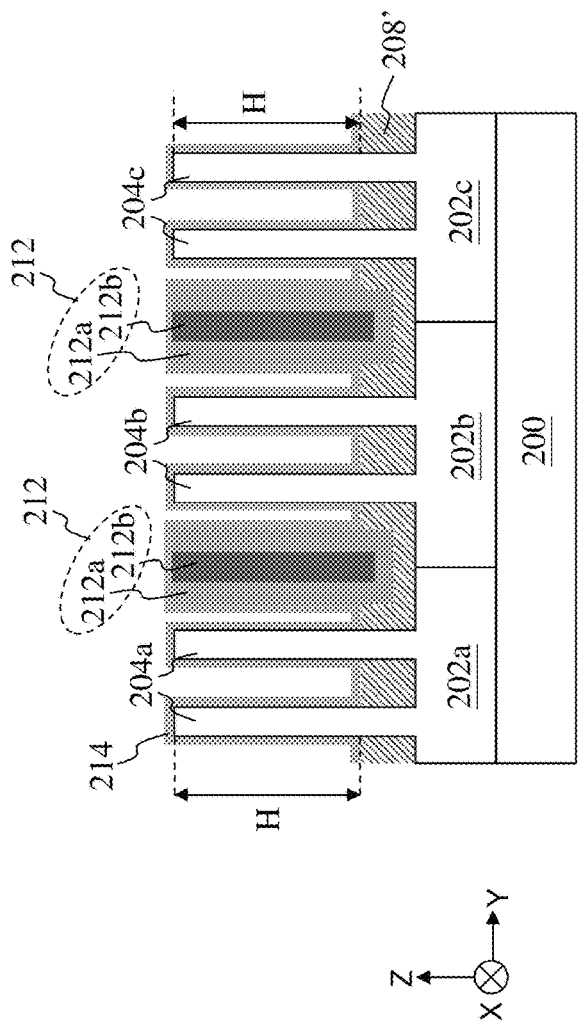
FIGURE 8A
FIGURE 8B

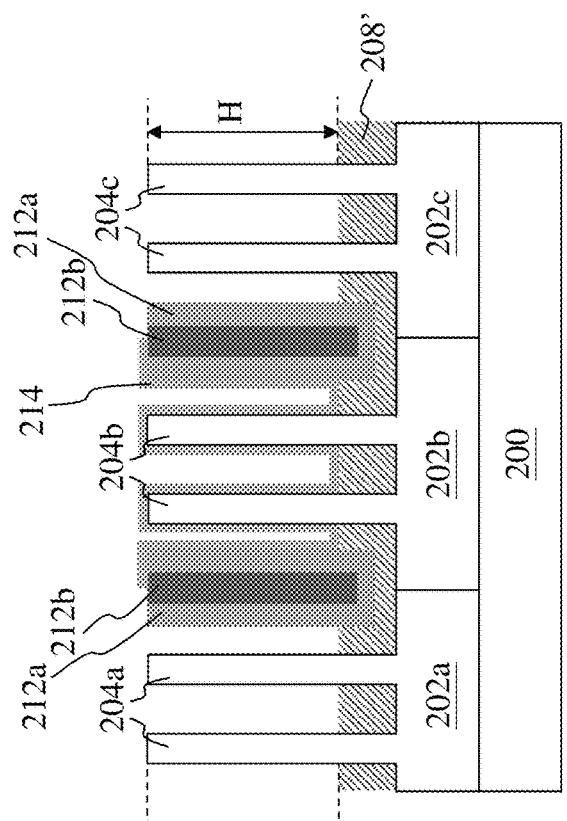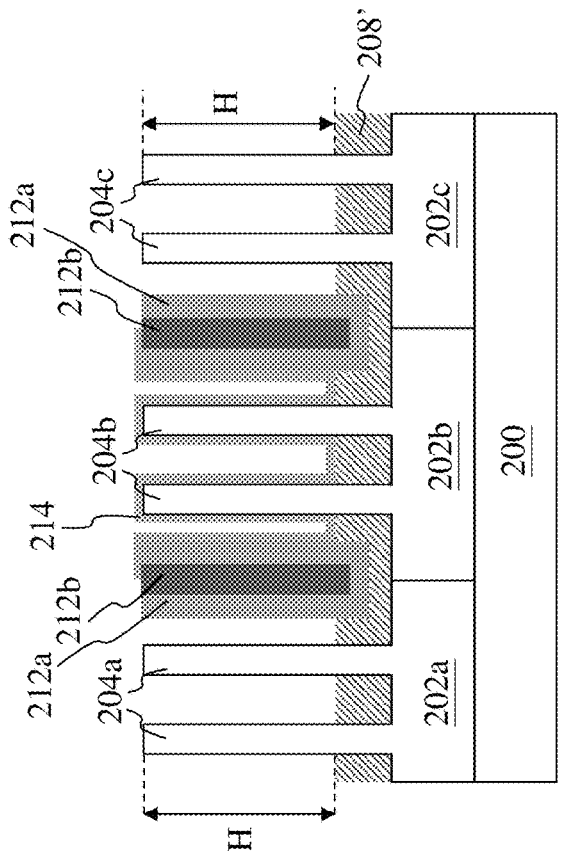
FIGURE 9A
FIGURE 9B

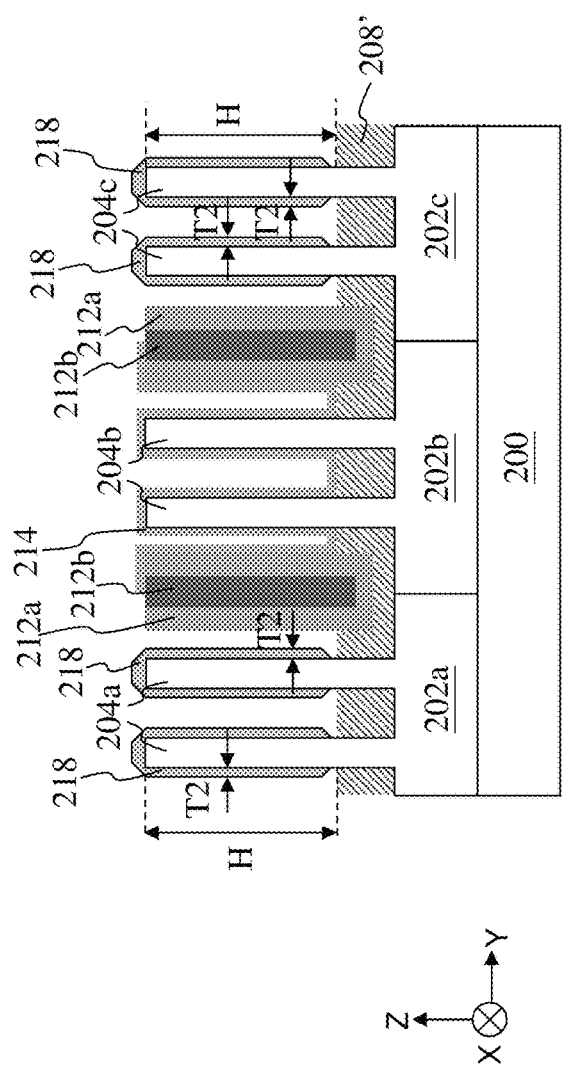
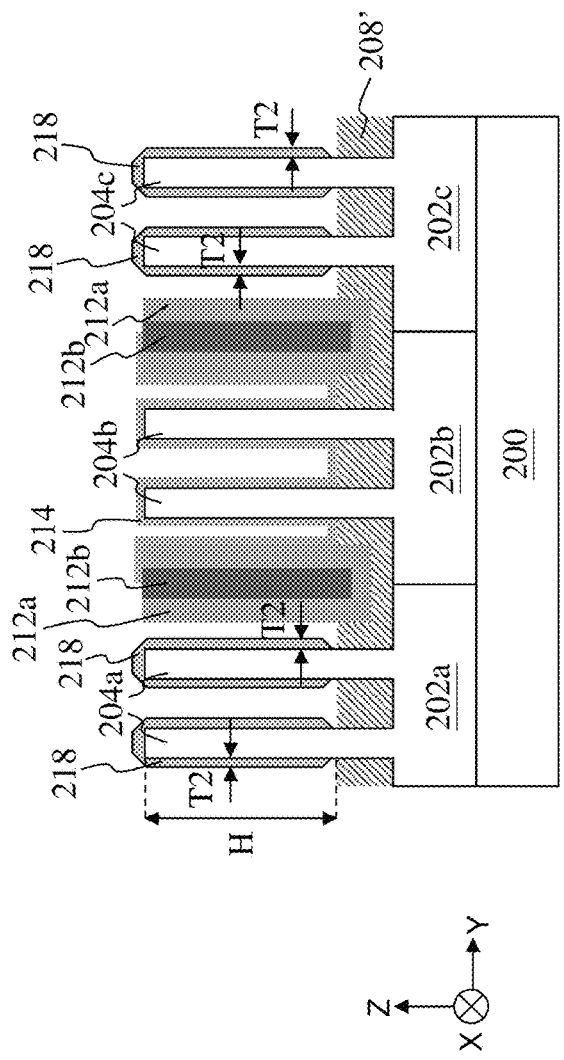
FIGURE 10A
FIGURE 10B

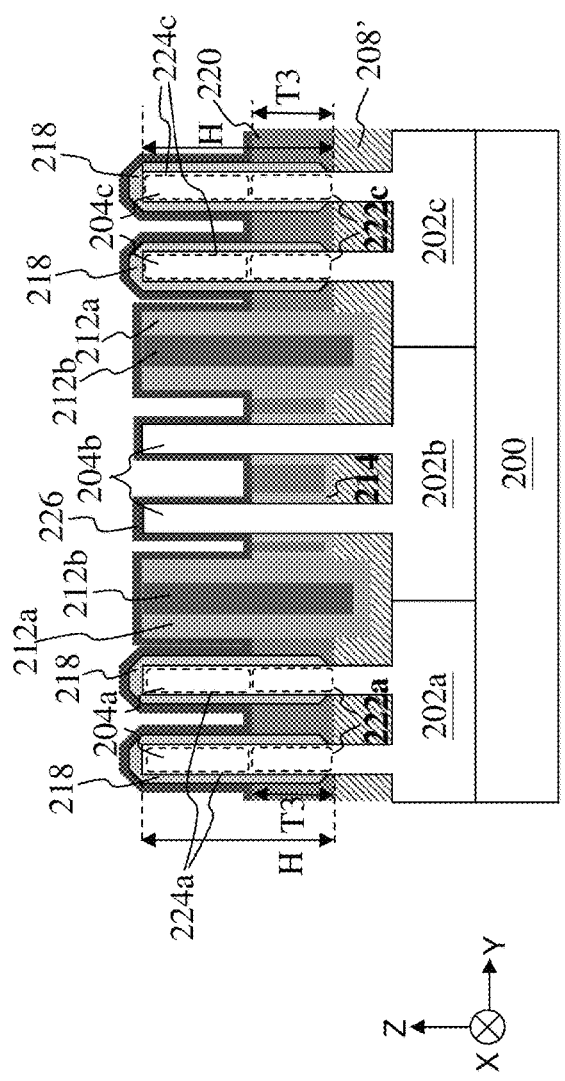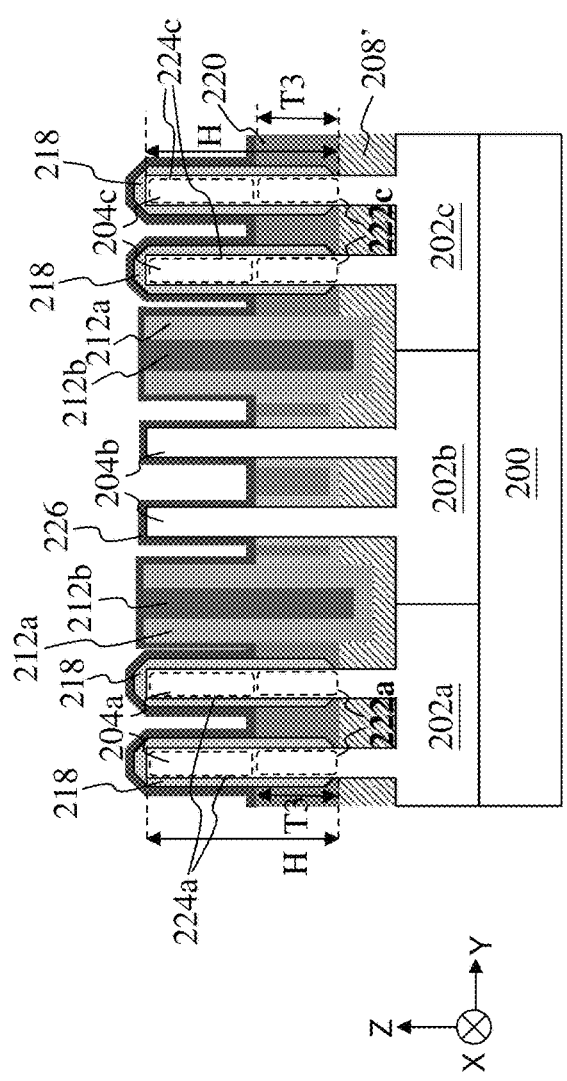
FIGURE 13A
FIGURE 13B

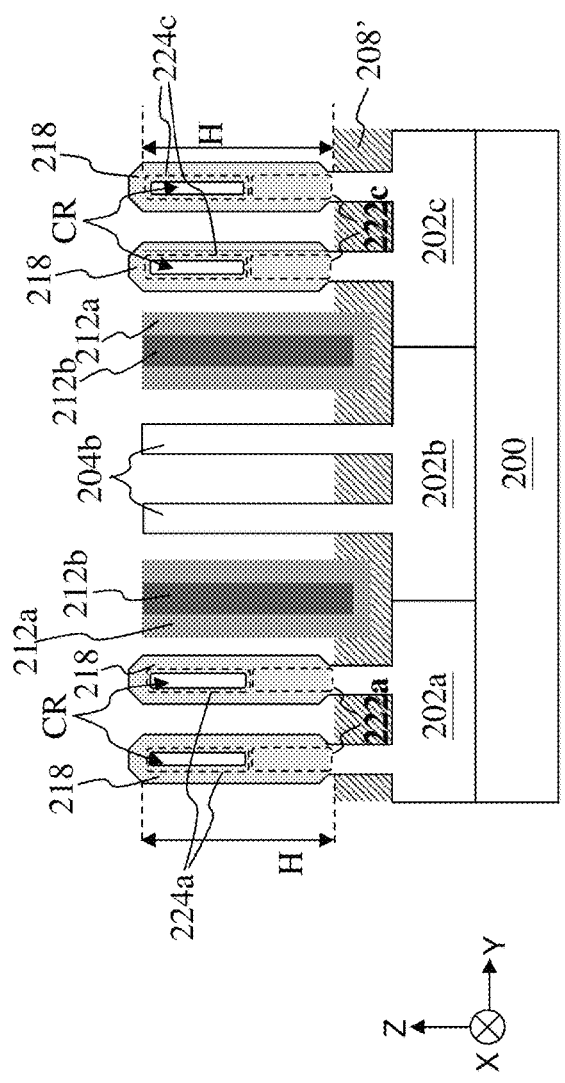
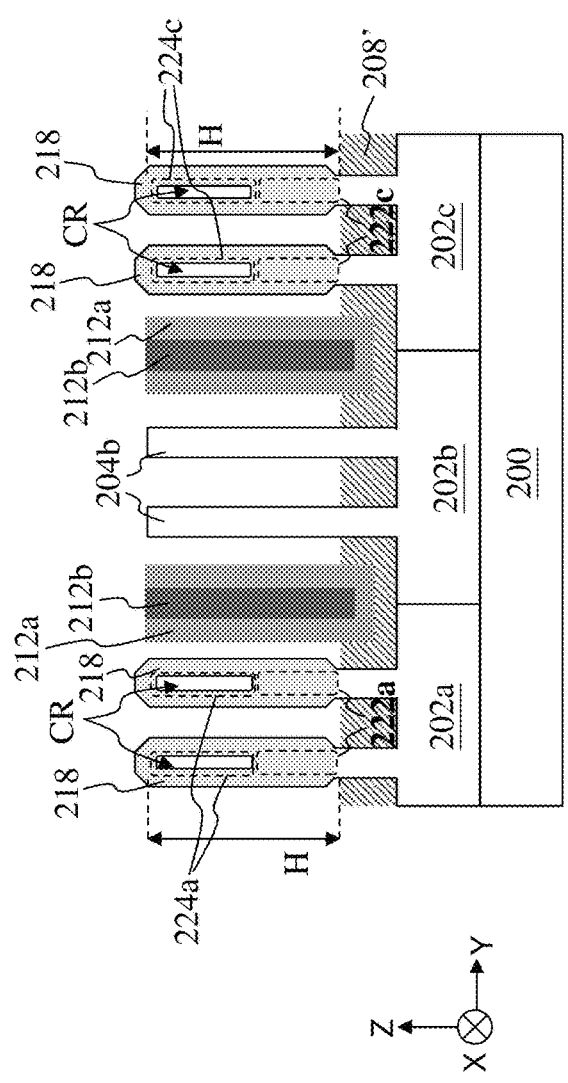
FIGURE 15A
FIGURE 15B

SEMICONDUCTOR DEVICE STRUCTURE WITH UNIFORM THRESHOLD VOLTAGE DISTRIBUTION AND METHOD OF FORMING THE SAME

PRIORITY DATA

This application claims priority to U.S. Provisional Patent Application Ser. No. 62/893,853 entitled "Semiconductor Device Structure with Uniform Threshold Voltage Distribution and Method of Forming the Same," and filed Aug. 30, 2019, which application is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). An example of such a multi-gate device is a fin field effect transistor (FinFET). A typical FinFET is fabricated with a vertical fin structure extending from a substrate. The fin structure is formed by, for example, etching away a portion of a silicon layer of the substrate. The channel of the FinFET is formed in the fin structure. A gate is provided over the structure (e.g. wrapping around the fin structure). Having a gate on multiple sides of the channel reduces short channel effect and allows for higher current flow.

Designing a FinFET is not without its own challenges. For example, while it is desirable to have a low threshold voltage to increase the on-state current (Ion), having a low threshold voltage can lead to high leakage current, including a non-negligible off-state current (Ioff). Consequently, one of the objectives in designing a FinFET is to achieve a threshold voltage that results in a good Ion/Ioff ratio. Furthermore, the threshold voltage in a FinFET is not constant throughout the height of the fin—it is affected by several factors introduced by the design itself or the fabrication processes. For example, the gate of the FinFET is in contact with three surfaces at a top region of the fin while only in contact with two opposing surfaces (e.g. opposing sidewalls) for the rest of the fin. In addition, the fin may not have uniform shape and width along its height. Furthermore, the distribution of anti-punch-through dopants and the source/drain features also affect the threshold voltage. As a result, a non-uniform threshold voltage distribution is usually observed. Often, portions of the fin with lower-than-expected threshold voltages suffer from high off-state current density, while portions of the fin with higher-than-expected threshold voltage suffer from low on-state current density.

Therefore, although existing FinFET devices have been generally adequate for their intended purposes, they have not been satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, 20A, and 21A, and 2B, 3B, 4B, 5B, 6B, 7B, 8B, 9B, 10B, 11B, 12B, 13B, 14B, 15B, 16B, 17B, 18B, 19B, 20B and 21B show cross-sectional views of a method of forming a semiconductor device structure, in accordance with an embodiment of the present disclosure;

DETAILED DESCRIPTION

Figure 1A:
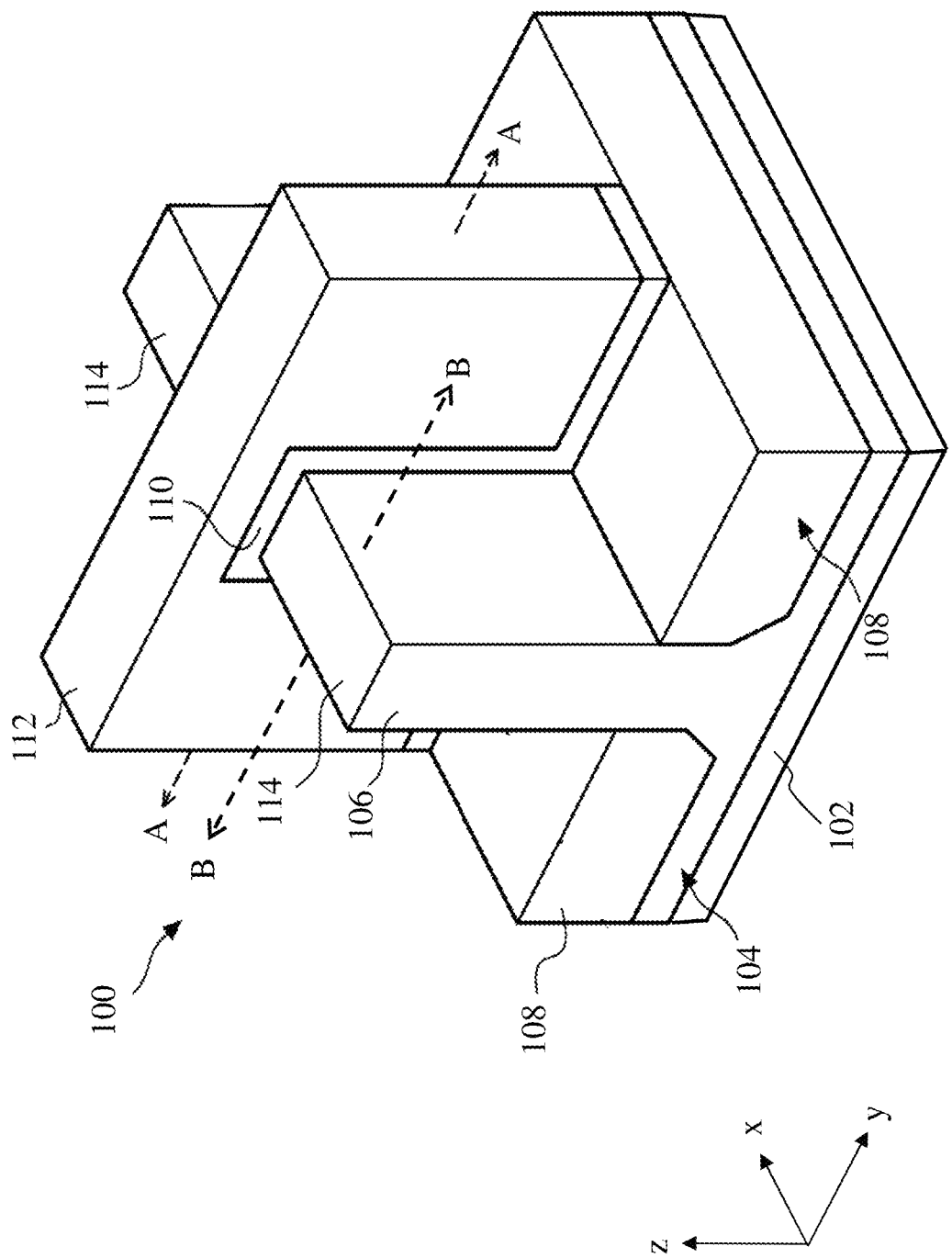
FIG. 1A illustrates a three-dimensional view of a semiconductor device structure, in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

FIG. 1A shows a three-dimensional view of a semiconductor device structure 100, in accordance with an embodiment. In the example of FIG. 1A, the semiconductor device structure 100 is a fin-like field effect transistor (FinFET) device. The semiconductor device structure 100 may be fabricated during manufacture or processing of an integrated circuit (IC) device or a portion thereof. The IC device may include, or may be, static random-access memory (SRAM) and/or other logic circuits, passive components such as resistors, capacitors, and inductors, and active components such as P-type field effect transistors (PFETs), N-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations.

The semiconductor device structure 100 of FIG. 1A includes a substrate 102, a doped region 104, and a fin structure 106 protruding from (e.g. extending vertically from) the doped region 104. Isolation regions 108 are formed over the doped region 104, and the fin structure 106 protrudes out of (e.g. extends vertically out of) the isolation regions 108, thereby spatially separates neighboring isolation regions 108. The fin structure 106 includes a channel region, and a gate stack engages the channel region of the fin structure 106. As an example, the gate stack includes a gate dielectric 110 that is disposed along sidewalls and over a top surface of the channel region of the fin structure 106. The gate stack further includes a gate electrode 112 that is disposed over the gate dielectric 110. The fin structure 106 includes source/drain regions 114 that are disposed on opposite sides of the channel region of the fin structure 106. FIG. 1A further illustrates reference cross-sections that are used in later figures. In particular, a cross-section along the line A-A is taken across the gate stack and the channel region of the fin structure 106, while a cross-section along the line B-B is taken across the source/drain region of the fin structure 106.

Figure 1B:
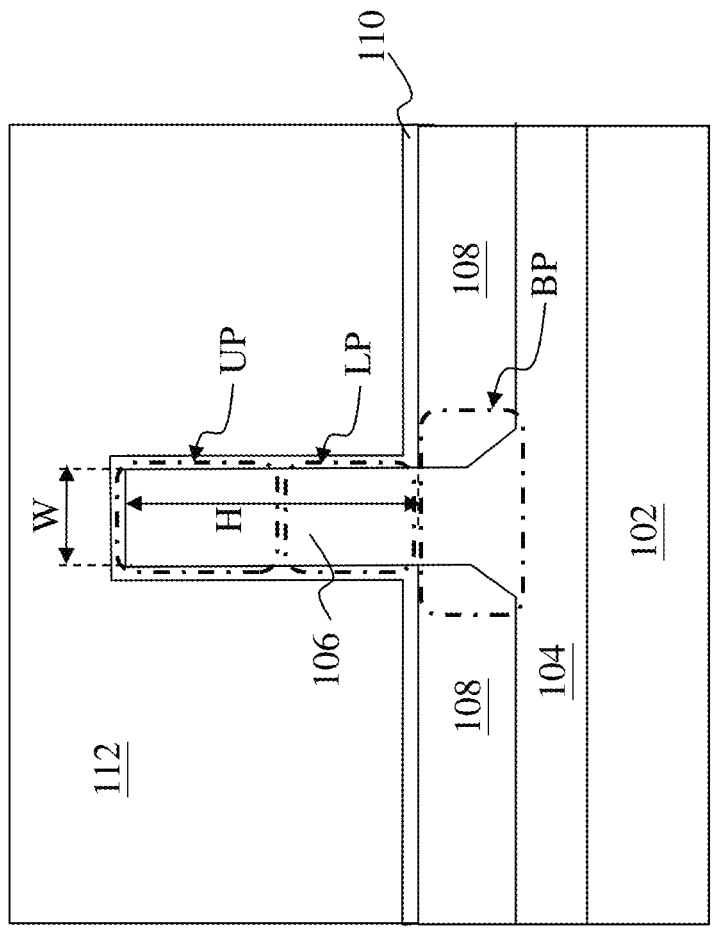
FIG. 1B illustrates a cross-sectional view of the semiconductor device structure shown in FIG. 1A, in accordance with an embodiment of the present disclosure.
Figure 1B:
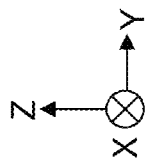

FIG. 1B shows a cross-sectional view along the line A-A of FIG. 1A. Because the gate stack covers a top surface and two sidewalls of the fin structure 106, the gate stack shown in FIG. 1B is usually referred to as a trigate. In some embodiments, a height H of the fin structure 106 (e.g. as measured in the Z-direction) may refer to the length of the portion of the fin structure 106 that protrudes out of the isolation regions 108, as shown in FIG. 1B. The portion of the fin structure 106 that is laterally surrounded (e.g. in the Y-direction) by the isolation regions 108 may be referred to as a base portion BP of the fin structure 106.

Embodiments of the present disclosure provide a semiconductor device structure with a uniform threshold voltage distribution along the height H of the fin structure 106, which in turn results in better DC performance of the semiconductor device structure (e.g. since variation of off-state current density and on-state current density along the height H of fin structures is reduced). For example, the fin structure 106 of the present disclosure has a uniform threshold voltage distribution along the height H of the fin structure 106 even though the trigate shown in FIG. 1B has a stronger effect over an upper portion UP of the fin structure 106 compared to a lower portion LP of the fin structure 106 and even though the width W of the fin structure 106 along the Y-direction (e.g. the distance between sidewalls of the fin structure 106) varies along the height H of the fin structure 106. The present disclosure also provides methods of forming a semiconductor device structure with a uniform threshold voltage distribution along the height H of the fin structure 106. The proposed method results in reduced material loss at the top surface of the fin structure 106 (e.g. fin top loss) during the manufacturing process and improved vertical fin profile tuning.

FIGS. 2A to 21A and 2B to 21B show cross-sectional views of a method of forming a semiconductor device structure with a uniform threshold voltage distribution along the height H of fin structures, in accordance with an embodiment of the present disclosure. FIGS. 2A-21A are taken along a channel region of the proposed semiconductor device structure (e.g. along the line A-A in FIG. 1A), while FIGS. 2B-21B are taken along a source/drain region of the proposed semiconductor device structure (e.g. along the line B-B in FIG. 1A).

Figure 2A:
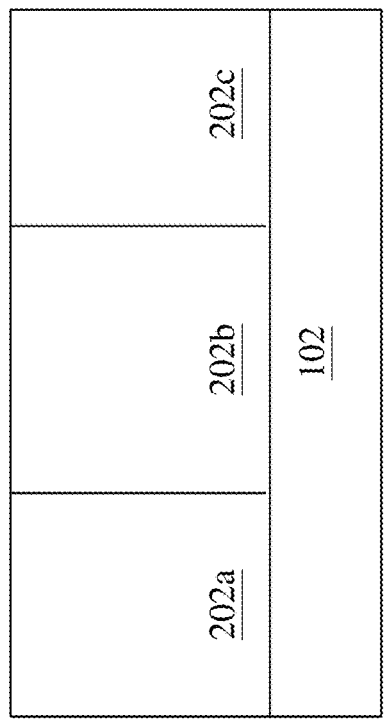
Figure 2A:
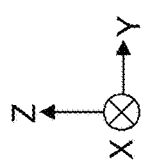
Figure 2B:
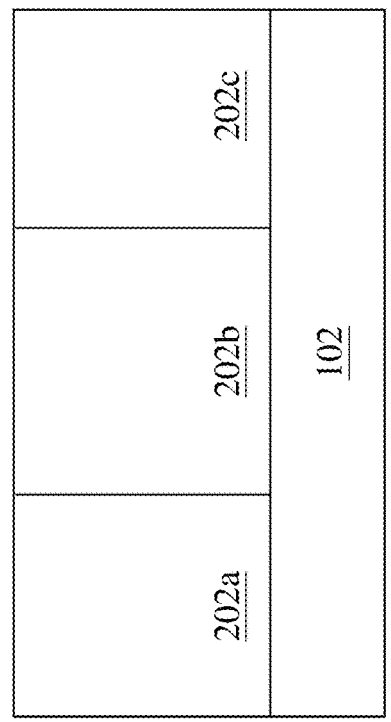
Figure 2B:
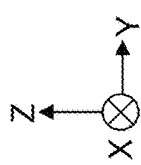

Referring to FIGS. 2A and 2B, a substrate 200 is provided. The substrate 200 may include, or may be, an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 200 may be a single-layer material having a uniform composition. Alternatively, the substrate 200 may include multiple material layers having similar or different compositions suitable for IC device manufacturing. In one example, the substrate 200 may be a silicon-on-insulator (SOI) substrate having a silicon layer formed on a silicon oxide layer. In another example, the substrate 200 may include a conductive layer, a semiconductor layer, a dielectric layer, other layers, or combinations thereof.

The substrate 200 includes various doped regions configured according to design requirements of the IC device. For example, the substrate 200 may include N-type doped regions (for example, N-type wells) doped with N-type dopants, such as phosphorus, arsenic, other N-type dopants, or combinations thereof. Additionally, the substrate 200 may include P-type doped regions (for example, P-type wells) doped with P-type dopants, such as boron (for example, $BF_2$), indium, other P-type dopants, or combinations thereof. In the example of FIGS. 2A and 2B, the N-type doped regions (e.g. N-well regions) are depicted as first region 202a and third region 202c, while the P-type doped region (e.g. P-well region) is depicted as second region 202b. The various doped regions can be formed directly on and/or in the substrate 200, for example, thereby providing a P-well structure, an N-well structure, a dual-well structure, a raised structure, or combinations thereof. The various doped regions may be formed by implantation of dopant atoms, in-situ doped epitaxial growth, a diffusion process, and/or other suitable techniques.

Figure 3A:
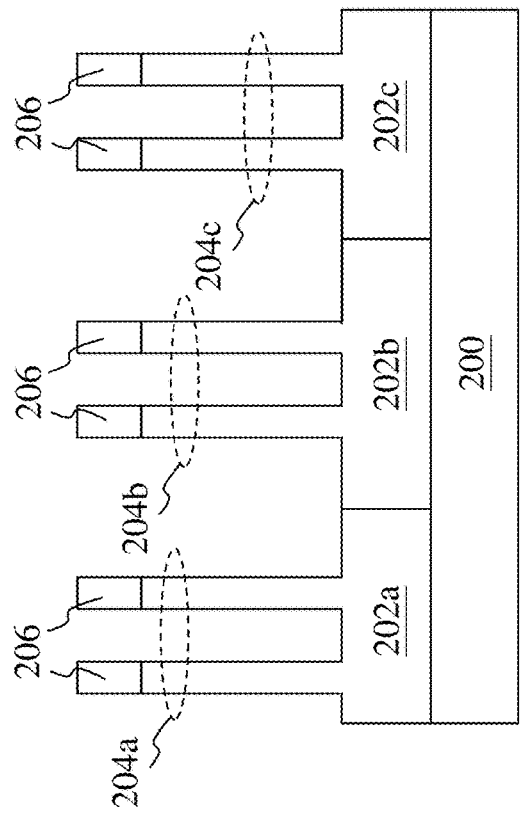
Figure 3B:
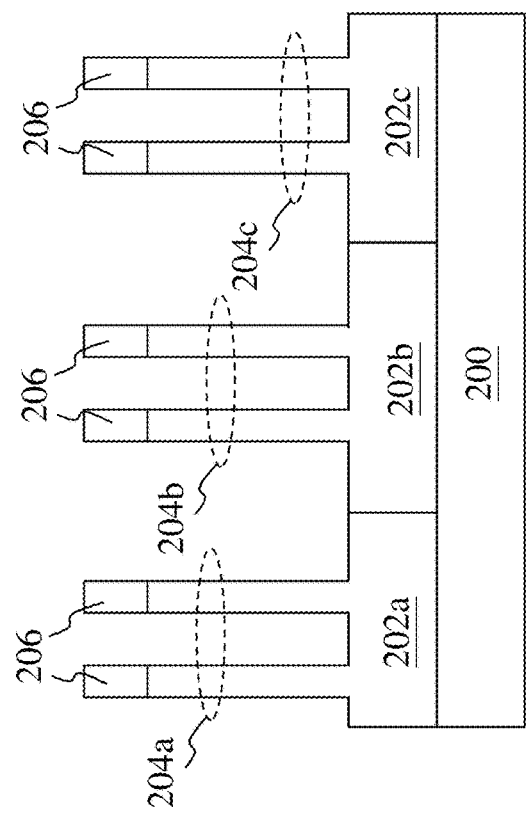

Referring to FIGS. 3A and 3B, one or more fin structures are formed in each of the first region 202a, the second region 202b, and the third region 202c. In the embodiment shown in FIGS. 3A and 3B, two fin structures 204a are formed in the first region 202a, two fin structures 204b are formed in the second region 202b, and two fin structures 204c are formed in the third region 202c. However, in other embodiments, the number of fin structures formed in each of the regions 202a, 202b, 202c may be different. Furthermore, the number of fin structures formed in each of the first region 202a, the second region 202b, and the third region 202c may be more than two or less than two in other embodiments. The fin structures 204a, 204c respectively formed in the first region 202a and the third region 202c (e.g. N-well regions) may be suitable for providing P-type semiconductor devices, while the fin structures 204b formed in the second region 202b (e.g. P-well region) may be suitable for providing one or more N-type semiconductor devices.

The fin structures 204a, 204b, 204c may be formed using any suitable process. In the example shown in FIGS. 3A and 3B, photolithography and etch processes are used to form fin structures 204a, 204b, 204c. For example, a first hard mask layer 206 may be formed on the substrate 200 and the regions 202a, 202b, 202c formed therein or thereon. In some examples, the first hard mask layer 206 includes a dielectric material such as a semiconductor oxide, a semiconductor nitride, a semiconductor oxynitride, or a semiconductor carbide. The first hard mask layer 206 may include two or more films stacked together, such as a silicon oxide film and a silicon nitride film in a stack. The first hard mask layer 206 may be formed by thermal growth, ALD, CVD, HDP-CVD, PVD, and/or other suitable deposition processes. The first hard mask layer 206 may include other suitable materials, such as a silicon oxide layer and a poly-silicon layer on the silicon oxide layer.

Subsequent to forming the first hard mask layer 206 on the regions 202a, 202b, 202c of the substrate 200, a photoresist (or resist) layer (not shown) is formed on the first hard mask layer 206. The resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning or lithography process.

In one embodiment, the resist layer is patterned to leave portions of the photoresist material disposed over the first hard mask layer 206 by the lithography process. After patterning the resist layer, an etching process is performed on the first hard mask layer 206, thereby transferring the pattern from the resist layer to the first hard mask layer 206. The remaining resist layer may be removed after the patterning the first hard mask layer 206. An exemplary lithography process includes spin-on coating the resist layer, soft baking the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the first hard mask layer 206 may include wet etching, dry etching or a combination thereof. In some embodiments, the etching process applied to the first hard mask layer 206 may include multiple etching steps. For example, a silicon oxide film in the first hard mask layer 206 may be etched by a diluted hydrofluorine solution and a silicon nitride film in the first hard mask layer 206 may be etched by a phosphoric acid solution.

The patterned first hard mask layer 206 is then used as an etch mask to pattern the regions 202a, 202b, 202c of the substrate 200. The etching process applied to the regions 202a, 202b, 202c of the substrate 200 may include any suitable etching technique such as dry etching, wet etching, other etching methods (e.g., reactive ion etching (RIE)), or a combination thereof. In some examples, the etching process applied to the regions 202a, 202b, 202c of the substrate 200 may include multiple etching steps with different etching chemistries, each targeting a particular material of the substrate 200. In some examples, the semiconductor material of the substrate 200 may be etched by a dry etching process using a fluorine-based etchant. In some embodiments, etching includes multiple etching steps with different etching chemistries, each targeting a particular material of the substrate 200 and each selected to resist etching the first hard mask layer 206. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may include etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The remaining portions of the regions 202a, 202b, 202c of the substrate 200 become the fin structures 204a, 204b, 204c.

The etching processes are designed to produce fin structures 204a, 204b, 204c of any suitable height and width extending from the substrate 200. Particularly, the etching process applied to the regions 202a, 202b, 202c of the substrate 200 is controlled such that the regions 202a, 202b, 202c are partially etched, as illustrated in FIGS. 3A and 3B. This may be achieved by controlling etching time or by controlling other etching parameter(s).

In the examples presented herein, the fin structures 204a, 204b, 204c extend lengthwise (e.g. longitudinally) in a first direction (e.g. in the X-direction) and are separated from each other (e.g. laterally) in a second direction (e.g. in the Y-direction). A height of each of the fin structures 204a, 204b, 204c is measured in a third direction (e.g. in the Z-direction). It is understood that the X-direction and the Y-direction are horizontal directions that are perpendicular to each other, and that the Z-direction is a vertical direction that is orthogonal (or normal) to a plane defined by the X-direction and the Y-direction. Each of the regions 202a, 202b, 202c of the substrate 200 may have its top surface aligned in parallel to the XY plane.

Figure 4A:
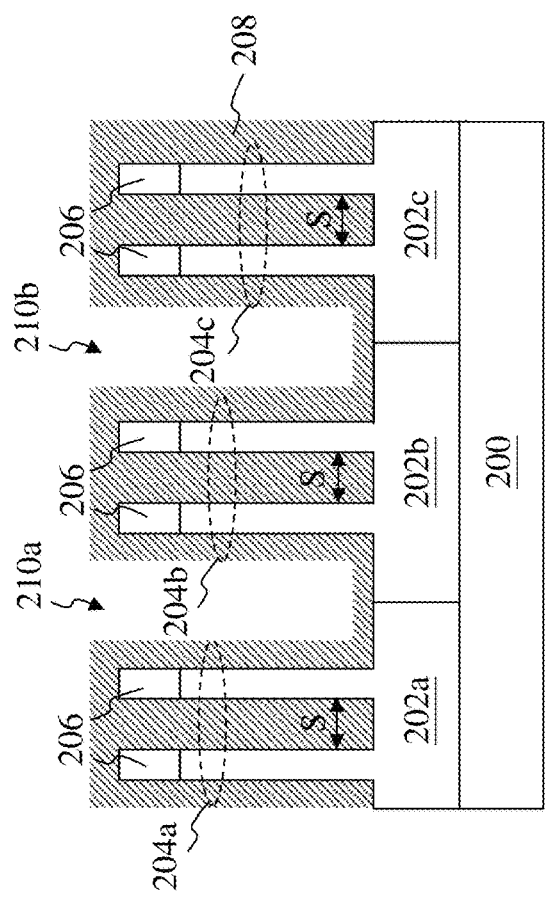
Figure 4B:
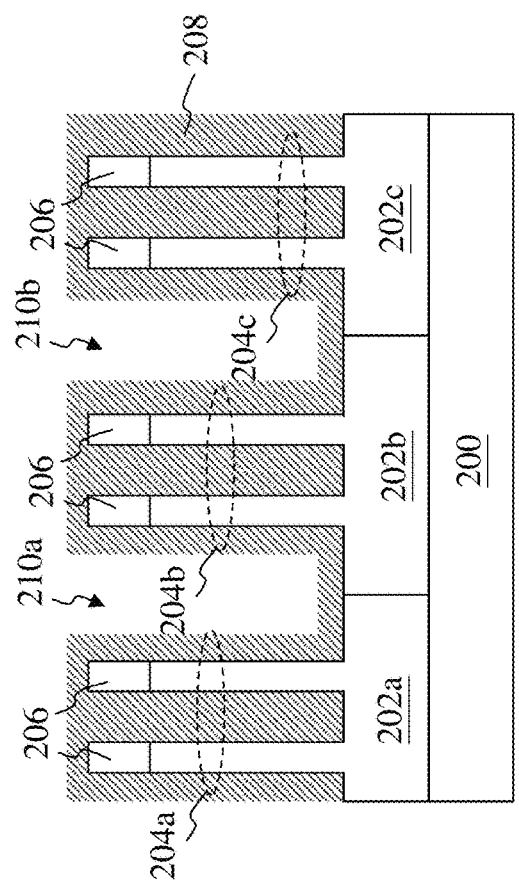
Figure 5A:
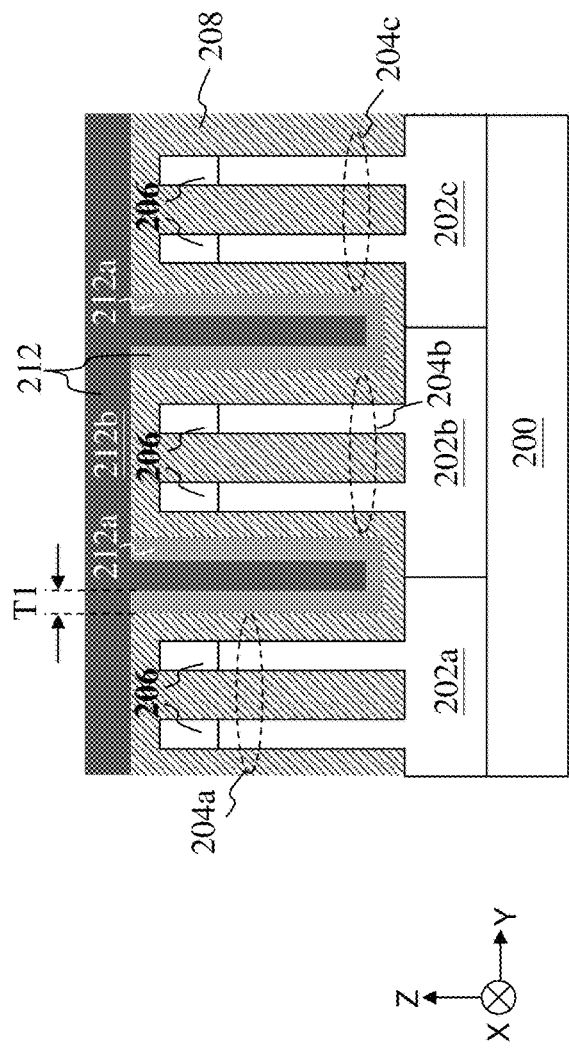
Figure 5B:
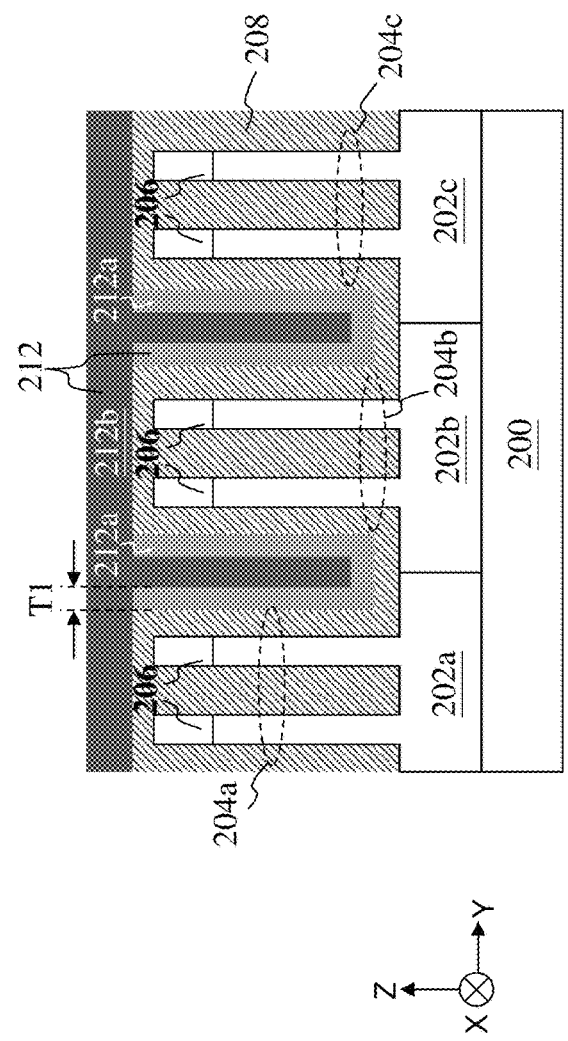

Referring to FIGS. 4A and 4B, a first dielectric layer 208 is formed on the fin structures 204a, 204b, 204c. In the present embodiment, the first dielectric layer 208 is formed with a conformal profile, covering the fin structures 204a, 204b, 204c. It is noted that although the first dielectric layer 208 is formed with a conformal profile, a relatively narrow spacing S (e.g. less than 2 nm) between adjacent ones of the fin structures 204a may be filled up (e.g. completely filled up) by the first dielectric layer 208. A similar result is seen in the spacing S between adjacent ones of the fin structures 204b and in the spacing S between adjacent ones of the fin structures 204c.

The first dielectric layer 208 may include a single dielectric material layer or multiple dielectric material layers. Suitable dielectric materials for the first dielectric layer 208 may include silicon oxides, silicon nitrides, silicon carbides, fluoro-silicate glass (FSG), low-K dielectric materials (e.g. a dielectric material having a dielectric constant less than a dielectric constant of $SiO_2$, which is approximately 3.9), other suitable dielectric materials, or a combination thereof. The dielectric material may be formed by any suitable technique including thermal growth, CVD, HDP-CVD, PVD, ALD, and/or spin-on techniques. In the illustrated embodiment, an ALD process is used as the conformal deposition technique. The first dielectric layer 208 constitutes, at least partially, an isolation feature, such as a shallow trench isolation feature (STI).

In the embodiment shown in FIGS. 4A and 4B, the conformal profile of the first dielectric layer 208 defines a first trench 210a and a second trench 210b. The first trench 210a spatially separates (e.g. in the Y-direction) the fin structures 204a from the fin structures 204b. The second trench 210b spatially separates (e.g. in the Y-direction) the fin structures 204b from the fin structures 204c.

Referring to FIGS. 5A, 5B, 6A, and 6B, dielectric fins 212 (also referred to as hybrid fins or fill fins) are formed in the first and second trenches 210a, 210b. The dielectric fins 212 are dielectric features that do not function as active regions. Instead, the dielectric fins 212 may be used for other purposes, such as tuning patterning density for better fabrication. The dielectric fins 212 may include multiple dielectric material layers. In the present embodiment, the dielectric fins 212 include a first fill dielectric layer 212a and a second fill dielectric layer 212b. In such an embodiment, the first fill dielectric layer 212a may be formed by ALD (e.g. to achieve a conformal profile in the trenches 210a, 210b), and the second fill dielectric layer 212b may be formed by flowable CVD (FCVD) or alternatively by spin-on coating. In the examples shown in this disclosure, the trenches 210a, 210b have substantially similar widths (e.g. as measured in the Y-direction). However, in other embodiments, the trenches 210a, 210b may have different widths. In embodiments where the trenches 210a, 210b have different widths, trenches having smaller dimensions (e.g., a width of less than 40 nm as measured in the Y-direction) may be completely filled by the first fill dielectric layer 210a, while trenches having greater dimensions (e.g., a width greater than 40 nm as measured in the Y-direction) may be completely filled by both the first fill dielectric layer 212a and the second fill dielectric layer 212b. For the trenches with the greater dimensions, the first fill dielectric layer is conformal to the trenches, as in the embodiment of FIGS. 5A and 5B. Thus, the trenches with larger dimensions have dual fill dielectric layers while the trenches with smaller dimensions have a single fill dielectric layer. In some examples, the first fill dielectric layer 212a has a thickness T1 (e.g. as measured in the Y-direction) in a range from about 1 nm to about 20 nm (e.g. from about 1 nm to about 3 nm).

Figure 6A:
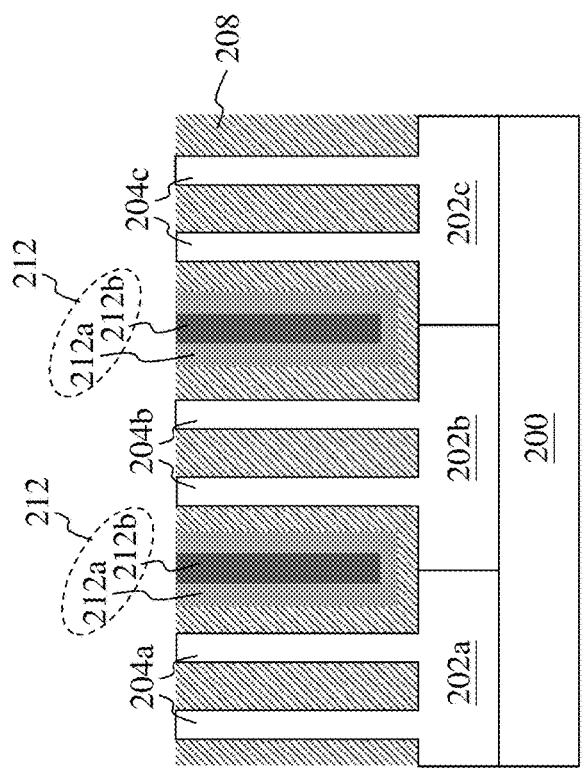
Figure 6B:
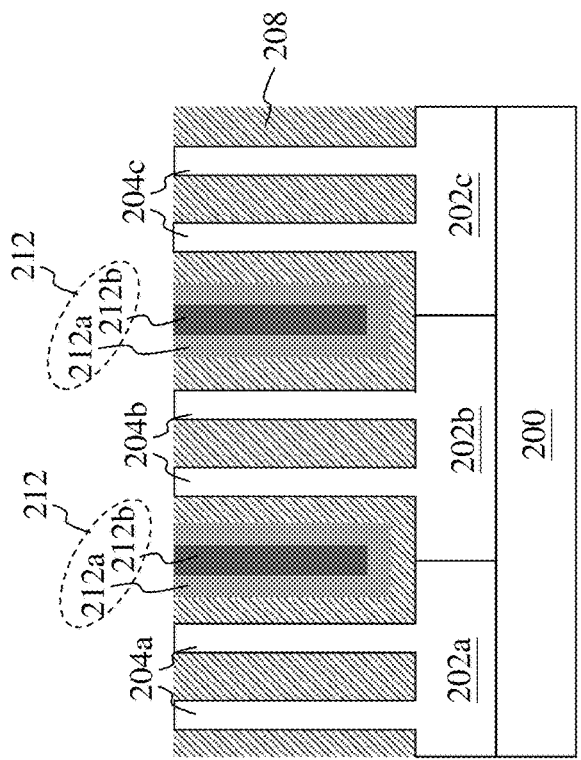

The fill dielectric layers 212a, 212b may include suitable dielectric materials that are different from that of the first dielectric layer 208 to achieve etching selectivity at a later etching stage. The first fill dielectric layer 212a and the second fill dielectric layer 212b may have different compositions. For examples, the first fill dielectric layer 212a may be a high-k dielectric material, such as hafnium oxide ($HfO_2$), or zirconium oxide ($ZrO_2$), while the second fill dielectric layer 212b may include a carbon-containing dielectric material, such as silicon carbon oxide, silicon carbon oxynitride or silicon carbon nitride. In other embodiments, the first fill dielectric layer 212a may include other suitable dielectric material, such as metal oxide (such as aluminum oxide $Al_2O_3$), or metal nitride (such as aluminum nitride AN), or a combination thereof. The second fill dielectric layer 212b may include other dielectric layer, such as silicon oxide, silicon oxynitride, silicon carbide nitride, and/or other suitable dielectric materials. In one example, the first fill dielectric layer 212a includes hafnium oxide deposited by ALD, and the second fill dielectric layer 212b includes silicon carbon oxide deposited by FCVD or spin-on deposition. Referring to FIGS. 6A and 6B, a polishing such as chemical mechanic polishing (CMP) process is performed to the dielectric fins 212 to planarize the top surfaces thereof and to remove the first hard mask layer 206 and excessive portions of the fill dielectric layers 212a, 212b. The polishing process exposes top surfaces of the fin structures 204a, 204b, 204c.

Referring to FIGS. 7A and 7B, the first dielectric layer 208 is selectively recessed such that the dielectric fins 212 and the fin structures 204a, 204b, 204c are extruded above the recessed first dielectric layer 208'. The fin structures 204a, 204b, 204c are electrically isolated from each other by the recessed first dielectric layer 208', which functions as an isolation feature. Consequently, the recessed first dielectric layer 208' may also be referred to as a dielectric isolation structure that surrounds base portions BP of the fin structures 204a, 204b, 204c. Any suitable etching technique may be used to recess the first dielectric layer 208, including dry etching, wet etching, RIE, and/or other etching methods. In an exemplary embodiment, an anisotropic dry etching is used to selectively remove the first dielectric layer 208 without etching the fin structures 204a, 204b, 204c and/or the dielectric fins 212, with a proper etching gas, such as fluorine-containing or chlorine-containing gas. The height H of the portions of the fin structures 204a, 204b, 204c that protrude out of the recessed first dielectric layer 208' may be determined by the etching depth of the etching process used to recess the first dielectric layer 208. In some embodiments, the height H (e.g. as measured in the Z-direction) may be in a range from about 45 nm to about 60 nm. This range of values may be needed for optimal device performance. For example, a height H greater than about 60 nm may result in etch process inefficiencies, an example being the deposition of residues on the surfaces of fin structures 204a, 204b, 204c, thereby adversely affecting device performance. As another example, a height H less than about 45 nm may result in a smaller current being induced between source and drain regions, thereby degrading device DC performance.

Referring to FIGS. 8A and 8B, a second dielectric layer 214 is formed with a conformal profile, covering exposed surfaces of the fin structures 204a, 204b, 204c, the dielectric fins 212, and the first dielectric layer 208. The second dielectric layer 214 may include or may be a material different from that of the recessed first dielectric layer 208' to provide etch selectivity. For example, the second dielectric layer 214 may include silicon nitride. The second dielectric layer 214 may be formed by any suitable technique including thermal growth, CVD, HDP-CVD, PVD, ALD, and/or spin-on techniques. In the illustrated embodiment, an ALD process is used as the conformal deposition technique.

Referring to FIGS. 9A and 9B, portions of the second dielectric layer 214 disposed within the boundaries of the first and third regions 202a, 202c are removed. This may be accomplished using photolithography and etching processes (e.g. as discussed above in reference to the first hard mask layer 206). Stated differently, portions of the second dielectric layer 214 disposed over the first and third regions 202a, 202c are removed. As a result of the process shown in FIGS. 9A and 9B, surfaces (e.g. sidewall surfaces and top surfaces) the fin structures 204a of the first region 202a and the fin structures 204c of the third region 202c are exposed. It is once again noted that the fin structures 204a and 204c may be suitable for providing P-type semiconductor devices. The operations that follow introduce a semiconductor material (e.g. a dopant that is compatible with silicon) into the fin structures 204a and 204c in order to provide a uniform threshold voltage along the height H of the fin structures 204a, 204c.

Referring to FIGS. 10A and 10B, a semiconductor liner layer 218 may be selectively formed on exposed sidewall surfaces and top surfaces of the fin structures 204a, 204c. In some embodiments, the semiconductor liner layer 218 may be formed by one or more epitaxial growth processes, whereby silicon-germanium (SiGe) features and/or other suitable semiconductor features are grown in a crystalline state on the fin structures 204a, 204c. In some embodiments, a thickness T2 of the semiconductor liner layer 218 (e.g. as measured in the Y-direction) may be in a range from about 2 nm to about 3 nm. In examples where the semiconductor liner layer 218 includes SiGe, a concentration of germanium in the semiconductor liner layer 218 may be in a range from about 20 atomic percent to about 70 atomic percent. In general, the concentration of germanium in the semiconductor liner layer 218 can be tuned based on the desired threshold voltage for the P-type semiconductor devices formed in the first region 202a and the third region 202c. Suitable epitaxy processes that may be used to form the semiconductor liner layer 218 include CVD deposition techniques (e.g., vapor-phase epitaxy (VPE) and/or ultra-high vacuum CVD (UHV-CVD)), molecular beam epitaxy, and/or other suitable processes. In the operation shown in FIGS. 10A and 10B, the second dielectric layer 214 functions, at least partially, as a mask that prevents formation of the semiconductor liner layer 218 on the fin structures 204b of the second region 202b.

Figure 11A:
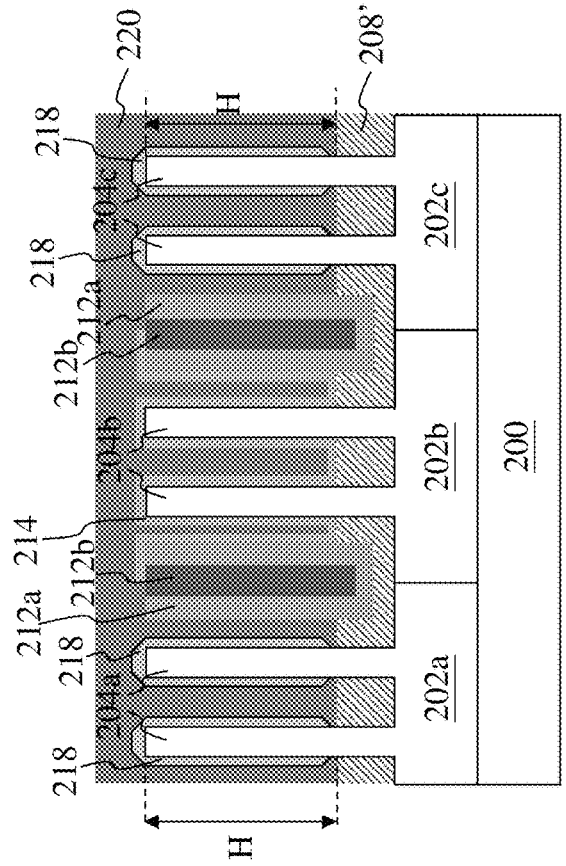
Figure 11B:
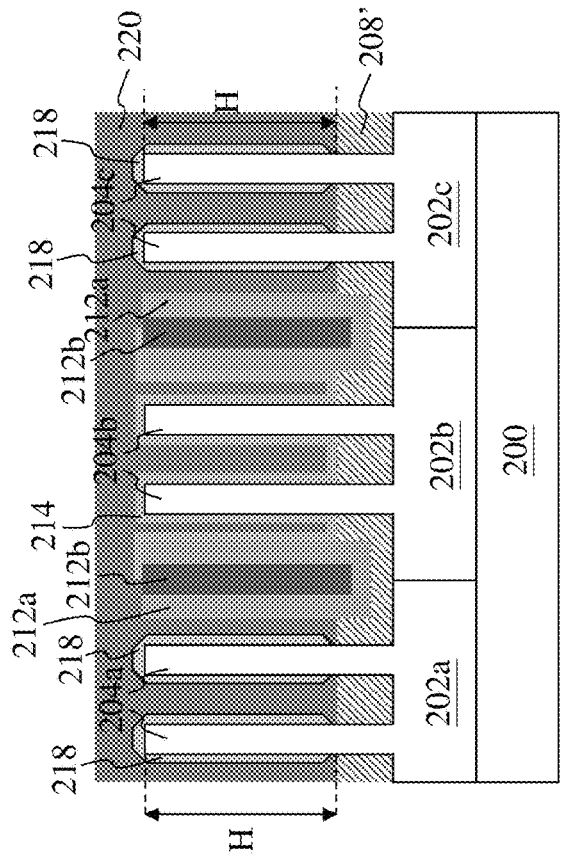

Referring to FIGS. 11A and 11B, a first capping layer 220 is formed over the structure of FIGS. 10A and 10B to, for example, fully cover the dielectric fins 212, the second dielectric layer 214 within the boundaries of the second region 202b, and the semiconductor liner layer 218 over the fin structures 204a, 204c. The first capping layer 220 may include a nitride (e.g. silicon nitride), an oxynitride (e.g. silicon carbon oxynitride (SiCON)), a carbonitride (e.g. silicon carbonitride (SiCN)), combinations thereof, or the like. In some embodiments, the first capping layer 220 and the second dielectric layer 214 may have similar compositions. The first capping layer 220 may be formed by any suitable technique including thermal growth, CVD, HDP-CVD, PVD, ALD, and/or spin-on techniques.

Figure 12A:
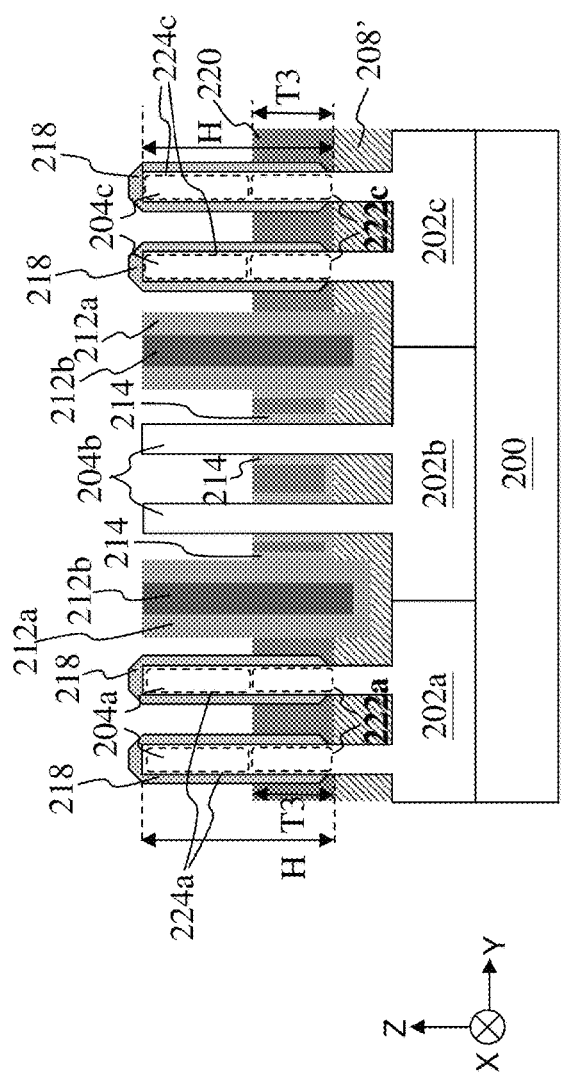
Figure 12B:
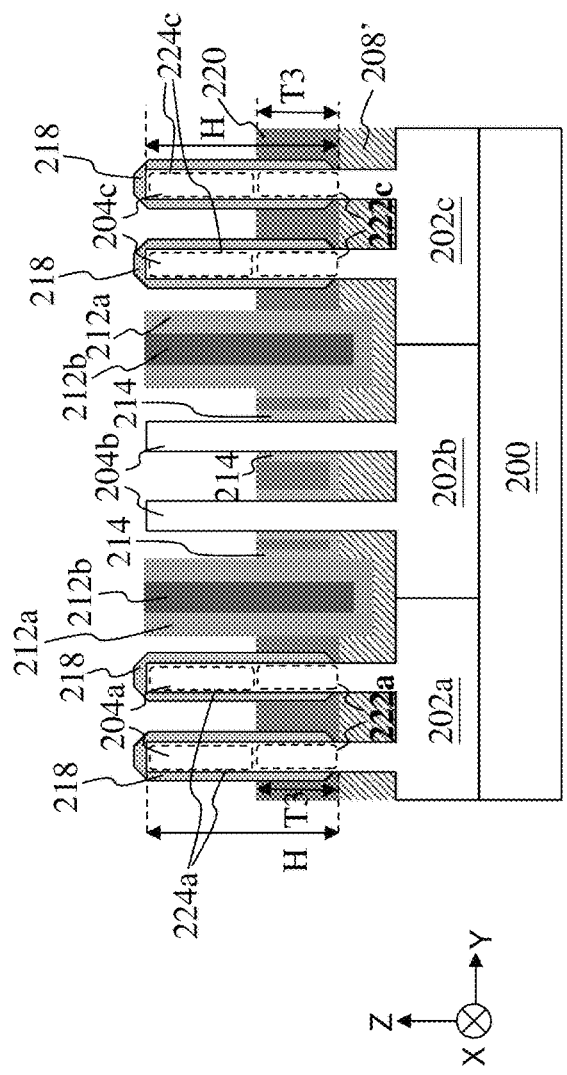

Referring to FIGS. 12A and 12B, the first capping layer 220 is etched back to form recesses between adjacent ones of the fin structures 204a, 204b, 204c and the dielectric fins 212. A thickness T3 of the first capping layer 220 (e.g. as measured in the Z-direction) remaining after the etch back process may be in a range from about 2 nm to about 4 nm. The etch back process causes the first capping layer 220 to physically contact portions of the semiconductor liner layer 218 that disposed on (e.g. laterally surround) portions 222a of the fin structures 204a and portions 222c of the fin structures 204c. In some embodiments, the portions 222a of the fin structures 204a and the portions 222c of the fin structures 204c may be lower or bottom portions of the fin structures 204a, 204c, respectively. Analogously, the etch back process causes portions of the semiconductor liner layer 218 that are disposed on portions 224a (e.g. upper portions) of the fin structures 204a and portions 224c (e.g. upper portions) of the fin structures 204c to be free from the first capping layer 220. The etch process used in the operation of FIGS. 12A and 12B may include wet etching, dry etching or a combination thereof. As an example, a wet etch process including a phosphoric acid solution may be used to etch back the first capping layer 220 in embodiments where the first capping layer 220 includes a nitride (e.g. silicon nitride). As seen in the examples of FIGS. 12A and 12B, the etch process may also etch back the second dielectric layer 214, especially in embodiments where the first capping layer 220 and the second dielectric layer 214 have similar compositions.

Referring to FIGS. 13A and 13B, a second capping layer 226 is formed with a conformal profile, covering exposed surfaces of the first capping layer 220, the semiconductor liner layer 218, fin structures 204b, and the dielectric fins 212. The second capping layer 226 is formed of a material different from the first capping layer 220. As shown in FIGS. 13A and 13B, the second capping layer 226 physically contact portions of the semiconductor liner layer 218 disposed on top surfaces of the fin structures 204a, 204c and that laterally surround portions 224a of the fin structures 204a and portions 224c of the fin structures 204c. The second capping layer 226 may include silicon oxide or a dielectric oxide material having a dielectric constant greater than a dielectric constant of silicon oxide (examples being aluminum oxide ($Al_2O_3$), hafnium oxide ($HfO_2$), zirconium oxide ($ZrO_2$), $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, combinations thereof, or the like). The second capping layer 226 may be formed by any suitable technique including ALD, CVD, thermal oxidation, ozone oxidation, etc.

Figure 14A:
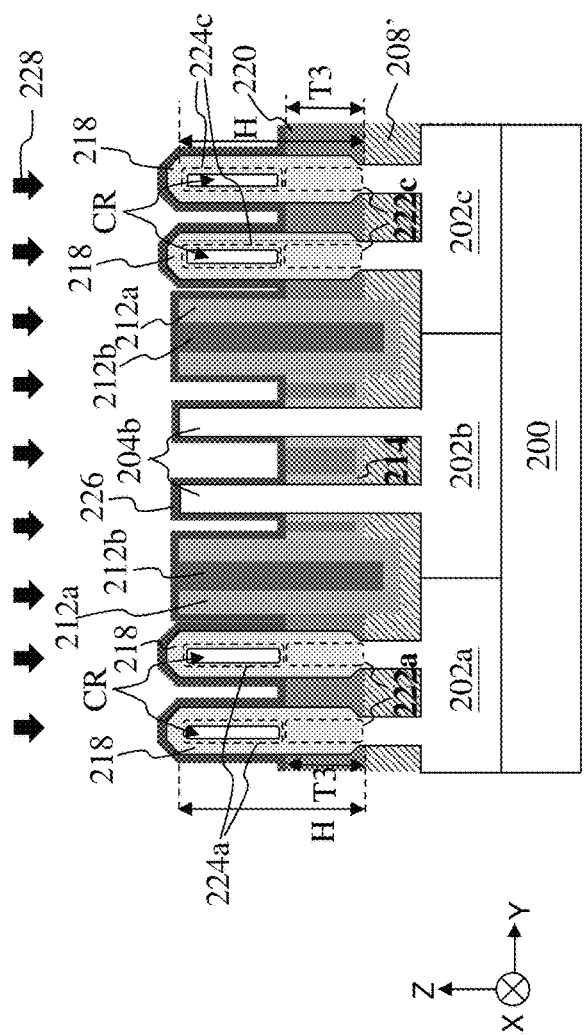
Figure 14B:
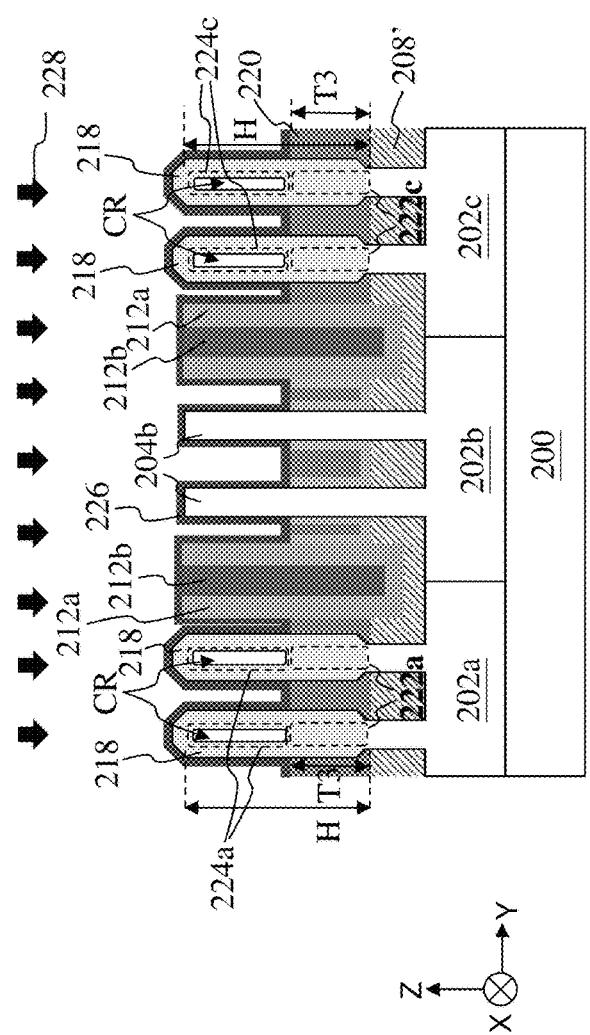

Referring to FIGS. 14A and 14B, an anneal process 228 is performed to induce a solid phase diffusion of dopants from the semiconductor liner layer 218 into the fin structures 204a, 204c. In embodiments where the semiconductor liner layer 218 includes SiGe, the anneal process 228 induces the solid phase diffusion (also referred to as solid-state diffusion) of germanium into the fin structures 204a, 204c. Suitable annealing processes include rapid thermal annealing (RTA), spike annealing, millisecond annealing, laser annealing, other suitable annealing techniques, or a combination thereof. The anneal process 228 may be performed at a temperature in a range from about 900 degrees Celsius to about 1100 degrees Celsius (e.g. about 950 degrees Celsius). A duration of the anneal process 228 may be in a range from about 5 seconds to about 60 seconds (e.g. in the range from about 10 seconds to about 50 seconds). The temperature ranges and duration ranges have an effect of increasing thermal stability of the first capping layer 220 and the second capping layer 226 to the anneal process 228 (e.g. since the stated temperature and/or duration ranges prevents the formation of cracks in the first capping layer 220 and the second capping layer 226). Furthermore, when the temperature and duration are in the stated ranges, the first capping layer 220 and the second capping layer 226 suppress dissipation or dissociation of dopants (e.g. germanium) from the semiconductor liner layer 218 before and during the anneal process 228. Additionally, the first capping layer 220 and the second capping layer 226 prevent oxidation of the semiconductor liner layer 218 before and during the anneal process 228.

The first capping layer 220 and the second capping layer 226, having different material compositions, have different effects on the drive-in of the dopant of the semiconductor liner layer 218 into the fin structures 204a, 204c. Generally, it has been noted that for the same temperature and duration of the anneal process 228, a nitride-containing capping layer causes a faster thermal drive-in of the dopant of the semiconductor liner layer 218 compared to an oxide-containing capping layer. Consequently, the dopant in portions of the semiconductor liner layer 218 overlying the lower portions 222a, 222c of fin structures 204a, 204c diffuses laterally (e.g. in the Y-direction) into the fin structures 204a, 204c at a faster rate than the dopant in portions of the semiconductor liner layer 218 overlying the upper portions 224a, 224c of fin structures 204a, 204c. As a result, the dopant concentration (e.g. average germanium concentration) in the lower portions 222a of fin structures 204a is greater than the dopant concentration (e.g. germanium concentration) in the upper portions 224a of the fin structures 204a. Similarly, the dopant concentration (e.g. average germanium concentration) in the lower portions 222c of fin structures 204c is greater than the dopant concentration (e.g. average germanium concentration) in the upper portions 224c of the fin structures 204c. As seen in FIGS. 14A and 14B, a result of the anneal process 228 and the different materials of the first capping layer 220 and the second capping layer 226 is that the dopant (e.g. germanium) is homogeneously distributed in the lower portions 222a, 222c of the fin structures 204a, 204c. In contrast, the dopant (e.g. germanium) is distributed along a peripheral region of the upper portions 224a, 224c of the fin structures 204a, 204c, while a central region CR (e.g. fin core) of each of the upper portions 224a, 224c is substantially free from the driven-in dopant (e.g. germanium).

Referring to FIGS. 15A and 15B, the first capping layer 220 and the second capping layer 226 are removed (e.g. using an etch process). Any suitable etching technique may be used to remove the first capping layer 220 and the second capping layer 226, including dry etching, wet etching, RIE, and/or other etching methods. In an exemplary embodiment, the second capping layer 226 (including an oxide-containing material) may be etched by a diluted hydrofluorine solution, while the first capping layer 220 (including a nitride-containing material) may be etched by a phosphoric acid solution. In another exemplary embodiment, an anisotropic dry etching is used to selectively remove the first capping layer 220 and the second capping layer 226 with a proper etching gas, such as fluorine-containing or chlorine-containing gas, without etching other features shown in FIGS. 15A and 15B.

Figure 16A:
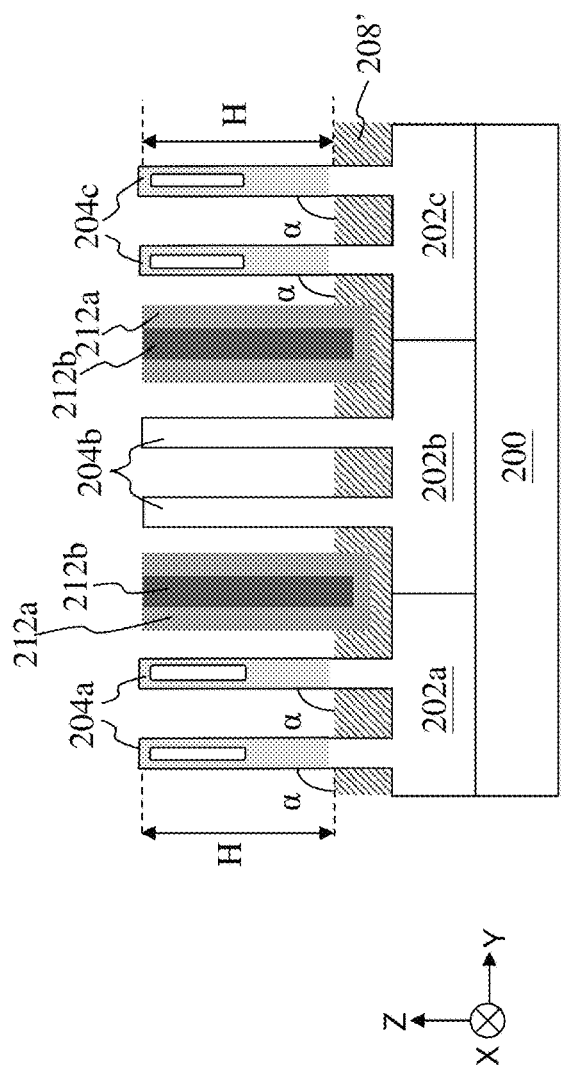
Figure 16B:
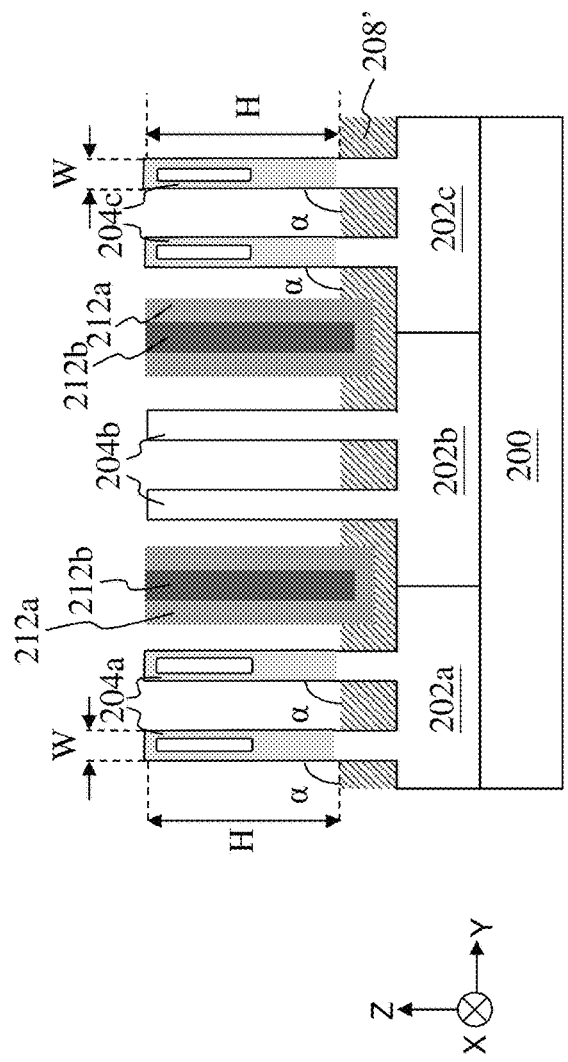
Figure 17A:
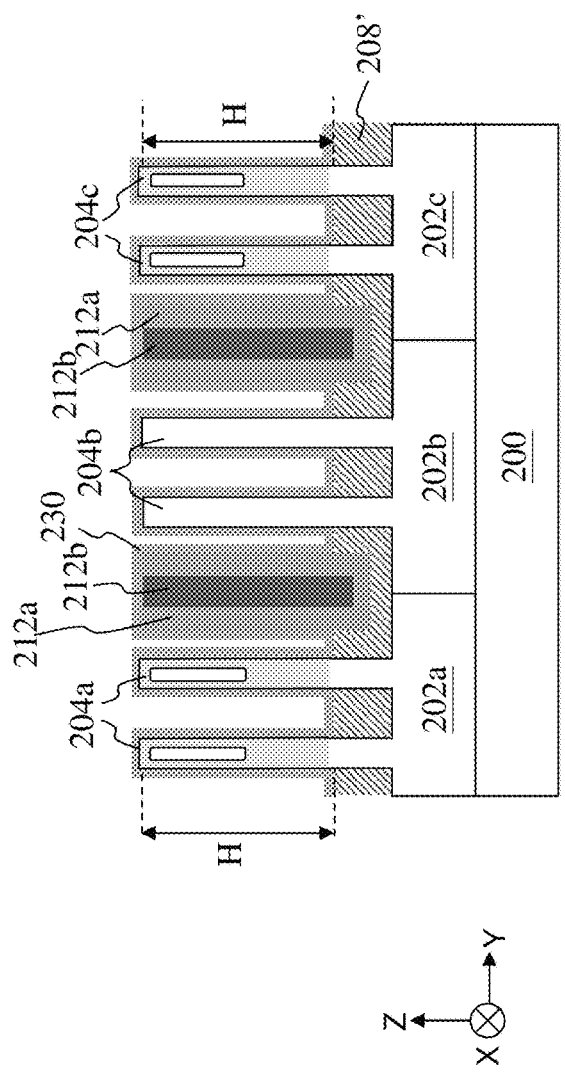
Figure 17B:
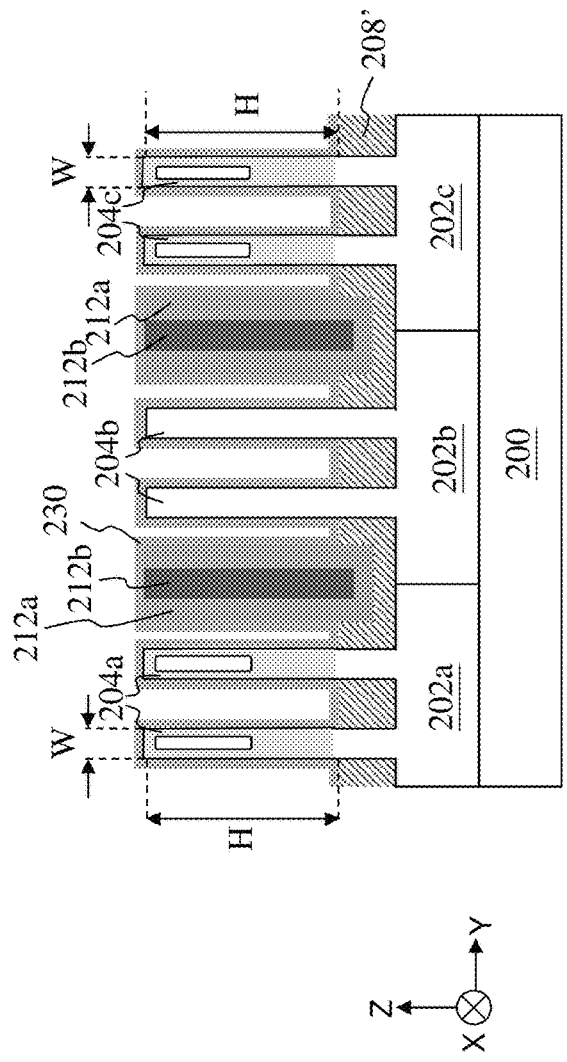

Referring to FIGS. 16A and 16B, a trim process is performed on the fin structures 204a, 204c. During the trim process, non-activated portions of the semiconductor liner layer 218 are removed, thereby reduce a dimension (e.g. width W, as measured in the Y-direction) of the fin structures 204a, 204c. In some embodiments, the width W may be in a range from about 5 nm to about 8 nm. In general, the width W may depend, at least in part, on the desired channel length for the P-type semiconductor devices formed in the first region 202a and the third region 202c. The trim process may include wet or dry etching processes known in the art. The intensity of the trim process may be greater at the upper portions of the fin structures 204a, 204c compared to the lower portions thereof. However, since the dopant concentration (e.g. average germanium concentration) in the upper portions of the fin structures 204a, 204c is less than the dopant concentration (e.g. average germanium concentration) in the lower portions of the fin structures 204a, 204c, fin top loss is reduced, thereby resulting in better vertical fin profile tuning and better control of the critical dimension (CD) of the fin structures 204a, 204c. In some embodiments, an angle α subtended between a sidewall of a fin structure of the fin structures 204a, 204c and a top surface of the recessed first dielectric layer 208' may be in a range from about 85° to about 95°.

In some embodiments, after the operation shown in FIGS. 16A and 16B, channel regions and source/drain regions of the fin structures 204a, 204b, 204c are processed to form gate structures and source/drain features therein, respectively. As an example, referring to FIGS. 17A and 17B, a third dielectric layer 230 is formed. In some embodiments, the third dielectric layer 230 includes silicon oxide deposited by a suitable method, such as ALD, CVD, thermal oxidation, ozone oxidation, etc. The formation of the third dielectric layer 230 may further include a subsequent annealing process to improve the material quality, such as increasing the material density and reducing the defects. In the present embodiment, the third dielectric layer 230 is a conformal layer to the profile of the fin structures 204a, 204b, 204c and the dielectric fins 212.

Figure 18A:
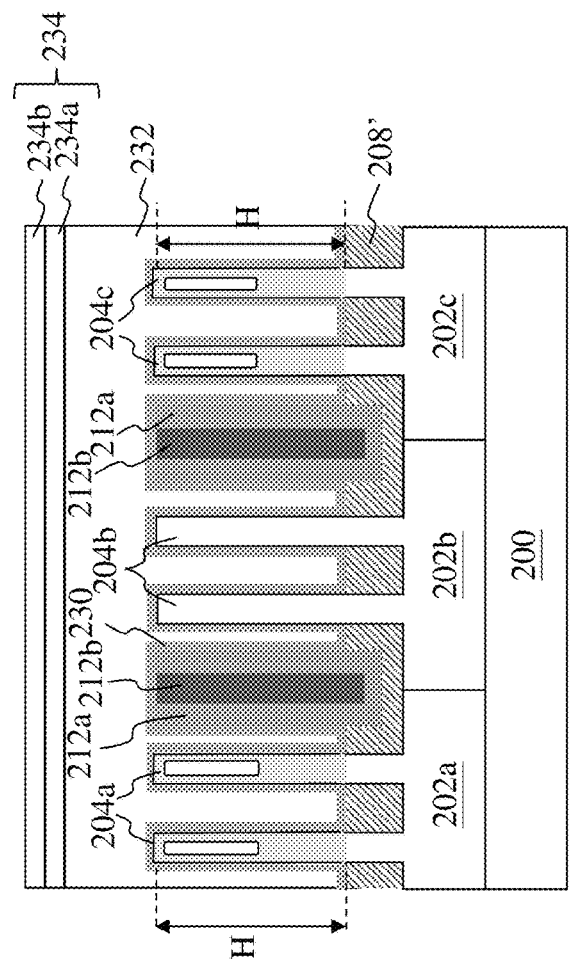
Figure 18B:
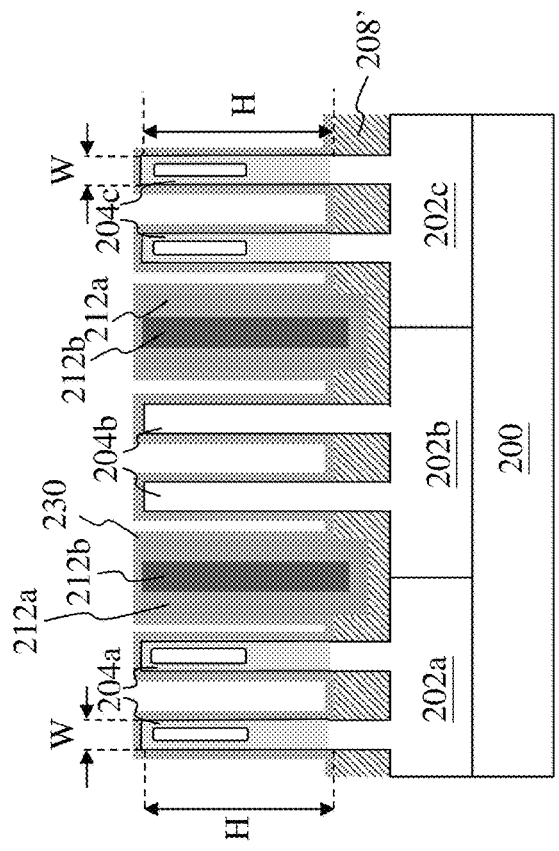

Referring to FIGS. 18A and 18B, a gate stack 232 is formed over channel regions of the fin structures 204a, 204b, 204c. The gate stack 232 may be replaced by metal gate stack at a later fabrication stage, and therefore also be referred to as a dummy gate stack. The dummy gate stack 232 may be formed by depositing a dummy gate layer containing polysilicon or other suitable material and patterning the layer. A gate hard mask layer 234 may be formed on the dummy gate material layer and may be used as an etch mask during the patterning of the dummy gate layer. The gate hard mask layer 234 may include any suitable material, such as a silicon oxide, a silicon nitride, a silicon carbide, a silicon oxynitride, other suitable materials, and/or combinations thereof. In one embodiment, the gate hard mask layer 234 includes dual mask material films 234a and 234b, such as silicon oxide and silicon nitride. In some embodiments, the patterning process to form the dummy gate stack includes forming a patterned resist layer by lithography process; etching the hard mask layer using the patterned resist layer as an etch mask; and etching the dummy gate layer to form the dummy gate stack using the patterned hard mask layer as an etch mask. In some embodiments, one or more gate sidewall feature (gate spacer, not shown) is formed on the sidewalls of the dummy gate stack 232. The gate sidewall feature may be used to offset the subsequently formed source/drain features and may be used for designing or modifying the source/drain profile. The gate sidewall feature may include any suitable dielectric material, such as a semiconductor oxide, a semiconductor nitride, a semiconductor carbide, a semiconductor oxynitride, other suitable dielectric materials, and/or combinations thereof. In some embodiments, the gate sidewall feature may include multiple layers, such as a first gate spacer (or a seal layer) on sidewalls of the dummy gate stack 232 and a second gate spacer on the first gate spacer. In furtherance of such embodiments, the first gate spacer is silicon oxide, and the second gate spacer is silicon nitride. In one example, the gate sidewall features are formed by deposition and anisotropic etching, such as dry etching. In another example, the first gate spacer is formed by ALD and the second gate spacer is formed by deposition and anisotropic etching.

Figure 19A:
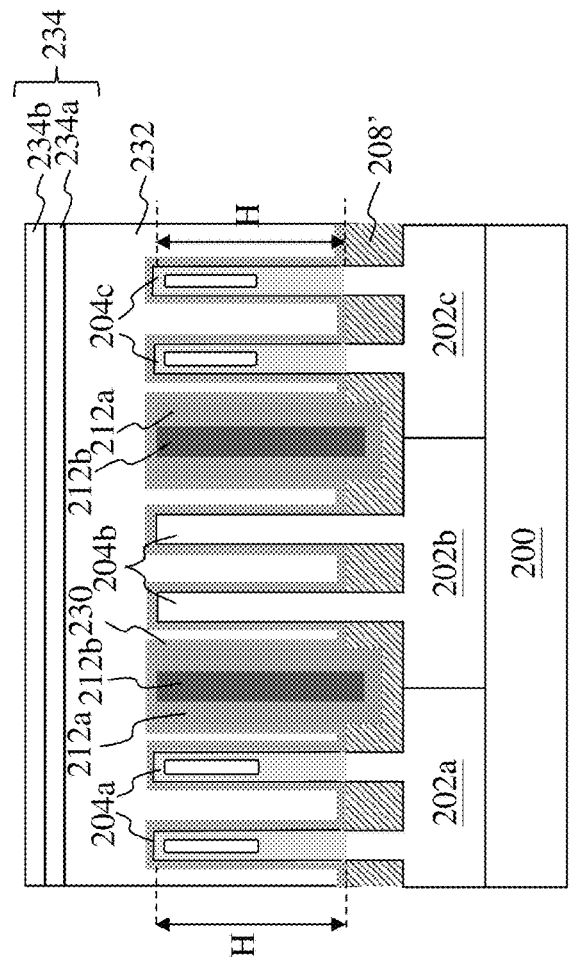
Figure 19B:
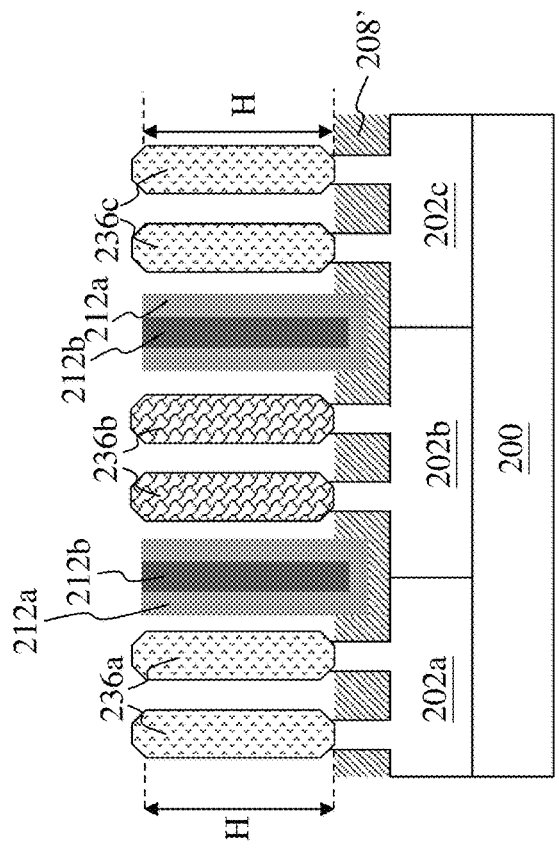

Referring to FIGS. 19A and 19B, epitaxial source/drain features 236a, 236b, 236c within the source/drain regions of fin structures 204a, 204b, 204c, respectively. The epitaxial source/drain features 236a, 236b, 236c may be formed by selective epitaxy growth for strain effect with enhanced carrier mobility and device performance. The dummy gate stack 232 and gate sidewall feature limit and constrain such that the source/drain features 236a, 236b, 236c are self-aligned in the source/drain regions. In many embodiments, the source/drain features 236a, 236b, 236c are formed by one or more epitaxial growth (epitaxial process), whereby silicon (Si) features, silicon germanium (SiGe) features, silicon carbide (SiC) features, and/or other suitable semiconductor features are grown in a crystalline state on the fin structures 204a, 204b, 204c within the source/drain regions thereof. In an alternative embodiment, such as in the example shown in FIGS. 19A and 19B, an etching process is applied to recess portions of the source/drain regions of the fin structures 204a, 204b, 204c before the epitaxy growth. The etching process may also remove any dielectric material disposed on the source/drain regions, such as during the formation of the gate sidewall features. Suitable epitaxy processes include CVD deposition techniques (e.g., vapor-phase epitaxy (VPE) and/or ultra-high vacuum CVD (UHV-CVD), molecular beam epitaxy, and/or other suitable processes.

The source/drain features 236a, 236b, 236c may be in-situ doped during the epitaxy process by introducing doping species including: P-type dopants, such as boron or $BF_2$; and N-type dopants, such as phosphorus or arsenic. If the source/drain features 236a, 236b, 236c are not in-situ doped, an implantation process (i.e., a junction implant process) is performed to introduce the corresponding dopant into the source/drain features 236a, 236b, 236c. In an exemplary embodiment, the source/drain features 236b of an N-type semiconductor device include silicon doped with phosphorous (SiP) or silicon carbide doped with phosphorous (SiCP). Source/drain features 236a, 236c of a P-type semiconductor device include silicon germanium doped with boron (SiGeB), SiGeSnB (tin may be used to tune the lattice constant) and/or GeSnB. In some other embodiments, source/drain features 236a, 236b, 236c may include more than one semiconductor material layers. One or more annealing processes may be performed thereafter to activate the source/drain features 236a, 236b, 236c. Suitable annealing processes include rapid thermal annealing (RTA), laser annealing processes, other suitable annealing technique or a combination thereof.

Figure 20A:
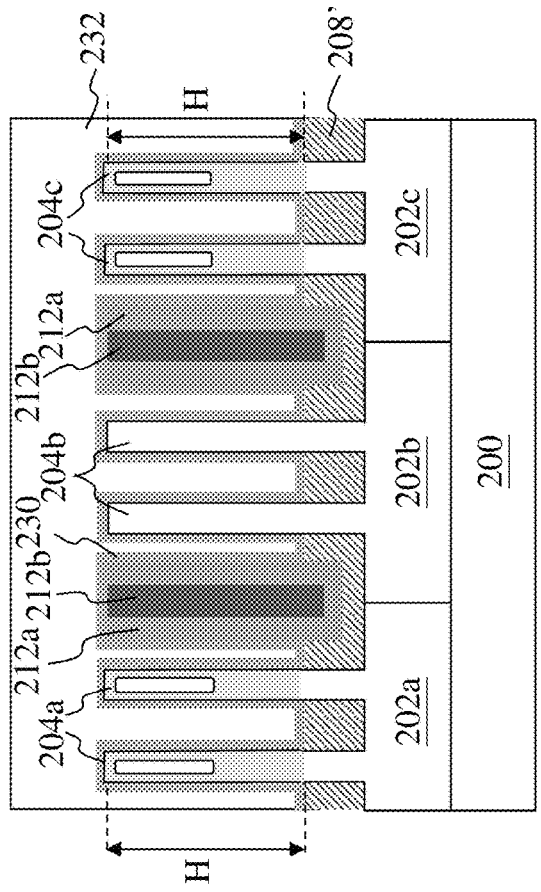
Figure 20B:
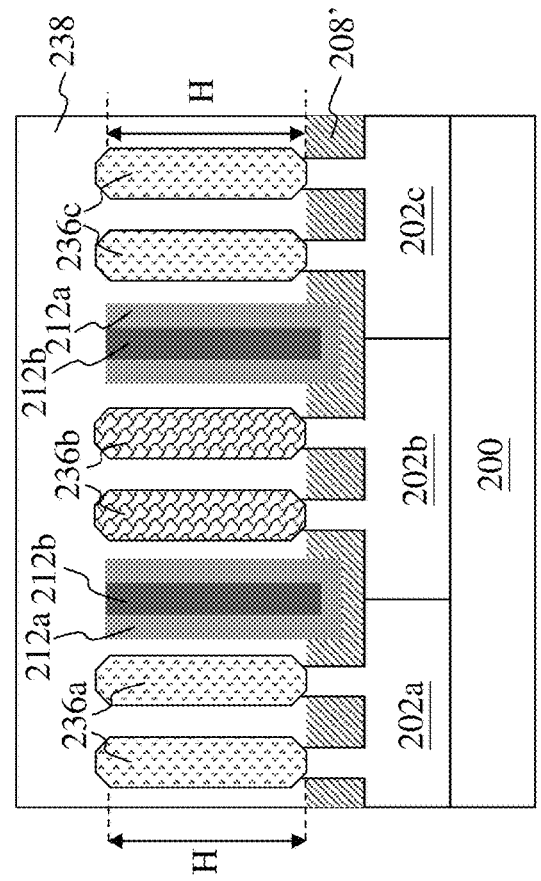

Referring to FIGS. 20A and 20B, an inter-level dielectric material (ILD) 238 is formed to cover the source/drain features 236a, 236b, 236c in the source/drain regions of the fin structures 204a, 204b, 204c. The ILD 238 acts as an insulator that supports and/or electrically isolates conductive traces (such as contacts, vias and metal lines) to be formed therein. The ILD 238 may include any suitable dielectric material, such as a silicon oxide, low-k dielectric material, porous dielectric material, other suitable dielectric material or a combination thereof. In some embodiments, an etch stop layer may be interposed between the ILD 238 and the source/drain features 236a, 236b, 236c. The etch stop layer functions as etch stopping during the etching to form contacts in the ILD during later fabrication stages. The etch stop layer includes a material different from that of the ILD 238 to provide etch selectivity. For example, the etch stop layer may include silicon nitride deposited by CVD or ALD. In some embodiments, the formation of the ILD 238 includes deposition and CMP to provide a planarized top surface. The gate hard mask layer 234 may be removed during the CMP process, an additional etching operation, or a combination thereof.

Figure 21A:
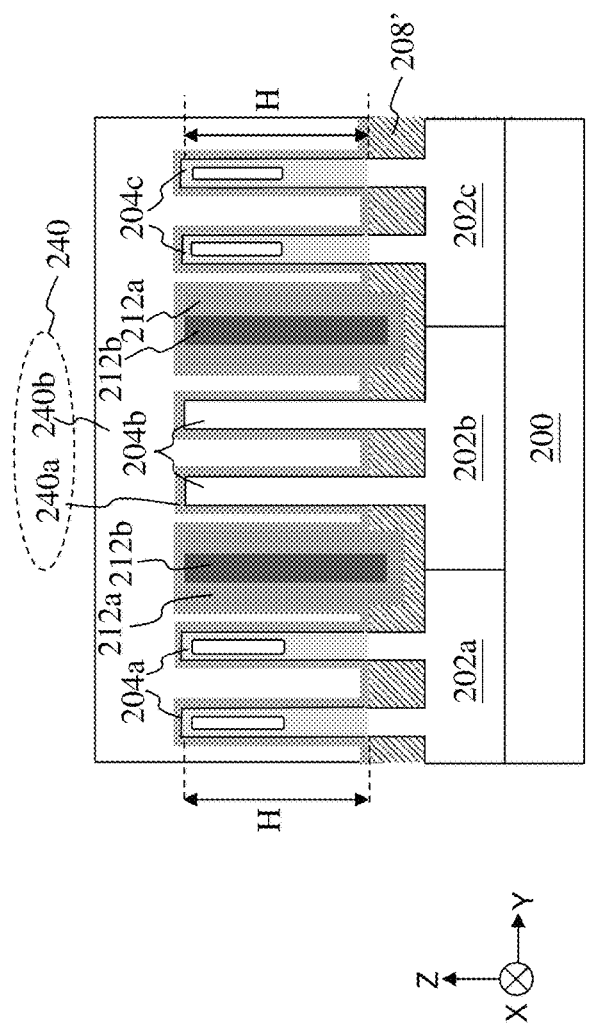
Figure 21B:
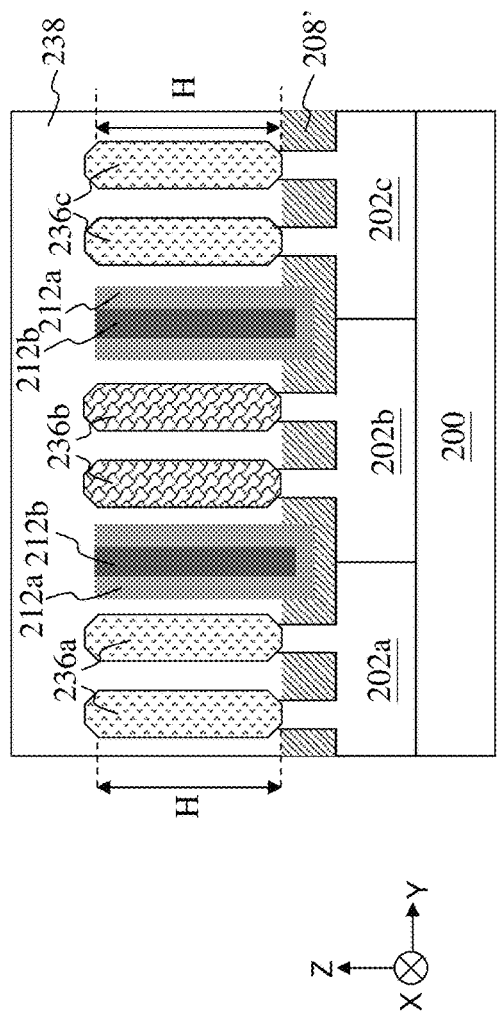

Referring to FIGS. 21A and 21B, metal gate stack 240 replaces the dummy gate stack 232. In an embodiment, one or more etching processes may be used to remove the dummy gate stack 232 and the third dielectric layer 230, thereby forming gate trenches. After the removal of the dummy gate stack 232 and the third dielectric layer 230, metal gate materials are deposited in the gate trenches, and a CMP process is applied to remove the excessive gate materials and planarize the top surface. The gate materials of the metal gate stack 240 include gate dielectric layer 240a and gate electrode 240b. In some embodiments, the gate dielectric layer 240a includes a high-k dielectric material, and the gate electrode 240b includes metal or metal alloy. The metal gate stack 240 is formed such that it wraps around the channel regions of the fin structures 204a, 204b, 204c. In some examples, the gate dielectric layer 240a and the gate electrode 240b each may include a number of sub-layers. The high-k dielectric layer may include metal oxide, metal nitride, such as LaO, AlO, ZrO, TiO, $Ta_2O_5$, $Y_2O_3$, $SrTiO_3$ (STO), $BaTiO_3$ (BTO), $Ba_7rO$, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The high-k dielectric layer is deposited a suitable technique, such as ALD, CVD, metal-organic CVD (MOCVD), PVD, thermal oxidation, and/or other suitable techniques. The gate dielectric layer 240a may additionally include an interfacial layer disposed between the fin structure and the high-k dielectric layer. The interfacial layer may include silicon oxide, silicon nitride, silicon oxynitride, and/or other suitable material, deposited by a suitable method, such as ALD, CVD, ozone oxidation, etc.

The gate electrode material is then filled in the gate trench. The gate electrode 240b is formed by ALD, PVD, CVD, plating, other suitable process, or a combination thereof. The gate electrode 240b may include a single layer or multiple layers, such as a metal layer, a liner layer, a wetting layer, and/or an adhesion layer. The gate electrode 240b may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFET and pFET devices with respective work functions, such as with a work function (WF) of 4.2 eV or less for nFET and a work function of 5.2 eV or greater for pFET. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the P-type WF metal includes titanium nitride (TiN) or tantalum nitride (TaN). In other embodiments, the p-metal include TiN, TaN, tungsten nitride (WN), titanium aluminum (TiAl), or combinations thereof. The P-type WF metal may include various metal-based films as a stack for optimized device performance and processing compatibility. The work function metal is deposited by a suitable technique, such as PVD. In other examples, a barrier layer may be formed on deposited for lining the gate trenches before filling the metal. The barrier layer may include titanium, titanium nitride, tantalum, tantalum nitride or combination, deposited by suitable technique, such as PVD. The gate electrode 240b includes a capping layer, a metal layer to tune the work function, and a filling metal, such as aluminum, copper or tungsten. In subsequent steps, contact features are formed to the metal gate stack 240 and the source/drain features 236a, 236b, 236c to electrically connect the FETs to form a functional circuit.

Figure 22:
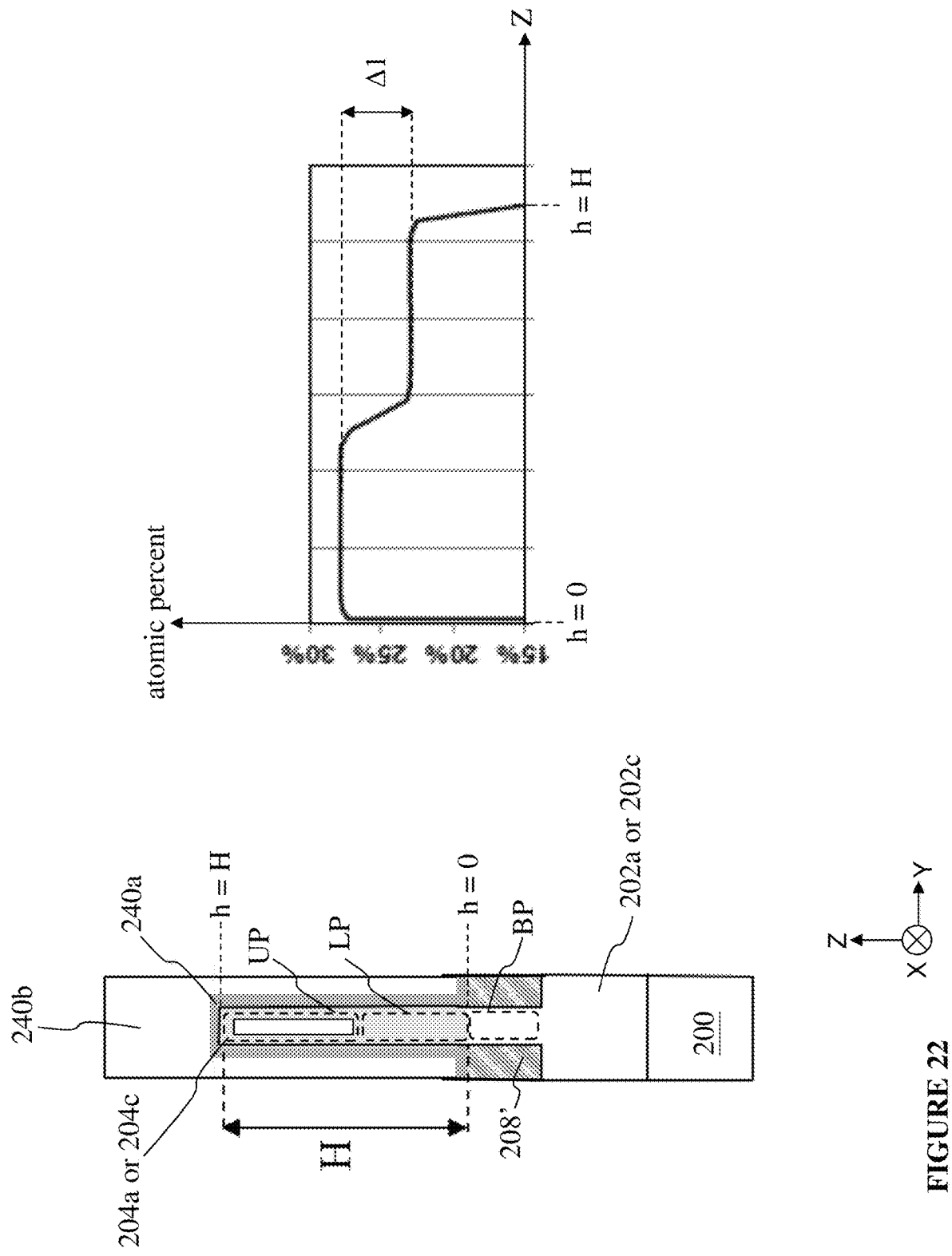
FIGS. 22 and 23 illustrate dopant concentration profiles along a height of fin structures, in accordance with embodiments of the present disclosure.

FIG. 22 shows a dopant (e.g. germanium) concentration profile along the height H of the fin structures 204a, 204c, according to aspects of the present disclosure. As seen in FIG. 22, each of fin structures 204a, 204c shows higher average dopant concentration in the lower portions LP of the fin structures 204a, 204c and lower average dopant concentration in the upper portions UP of the fin structures 204a, 204c. In some instances, the dopant concentration in the base portions BP of the fin structures 204a, 204c is zero. In some implementations, the difference between the average dopant concentration in the upper portions UP of the fin structures 204a, 204c and the average dopant concentration in the lower portions LP of the fin structures 204a, 204c (depicted in FIG. 22 as concentration difference $\Delta 1$) is within the range from about 3% to about 10% (e.g. about 5%). This range of values for the concentration difference $\Delta 1$ has an advantageous effect on device performance since the stated range balances the need for a device boost (e.g., by inducing a strain in the channel through lattice mismatch) and the need for threshold voltage uniformity.

Figure 23:
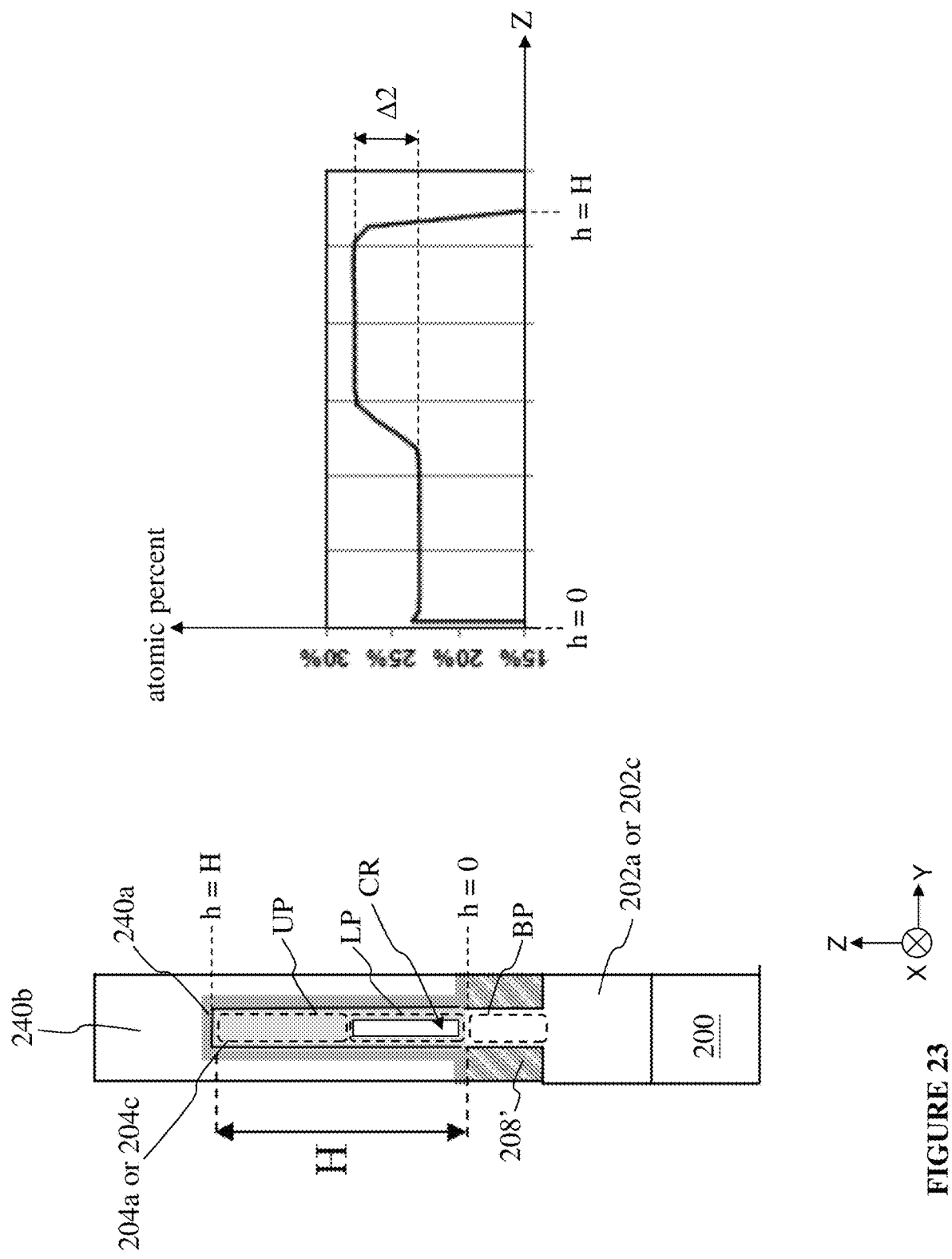

In the embodiments discussed above, the first capping layer 220 is a nitride-containing layer, while the second capping layer 226 is an oxide-containing layer. In other embodiments, the compositions may be switched namely, the first capping layer 220 is an oxide-containing layer, while the second capping layer 226 is a nitride-containing layer. FIG. 23 shows a dopant (e.g. germanium) concentration profile along the height H of the fin structures 204a, 204c in such embodiments. In FIG. 23, each of fin structures 204a, 204c shows higher average dopant concentration in the upper portions UP of the fin structures 204a, 204c and lower average dopant concentration in the lower portions LP of the fin structures 204a, 204c. In some instances, the dopant concentration in the base portions BP of the fin structures 204a, 204c is zero. In some implementations, the difference between the average dopant concentration in the upper portions UP of the fin structures 204a, 204c and the average dopant concentration in the lower portions LP of the fin structures 204a, 204c (depicted in FIG. 23 as difference $\Delta 2$) is within the range from about 3% to about 10% (e.g. about 5%). This range of values for the concentration difference $\Delta 2$ has an advantageous effect on device performance since the stated range balances the need for a device boost (e.g., by inducing a strain in the channel through lattice mismatch) and the need for threshold voltage uniformity.

Although the semiconductor device structure proposed herein has a non-uniform dopant concentration profile along the height H of the fin structures 204a, 204c, the result of such a non-uniform concentration profile is a uniform threshold voltage distribution along the height H of fin structures 204a, 204c. The non-uniform dopant concentration profile along the height H of the fin structures 204a, 204c compensates for the factors that might affect the threshold voltage along the height H of fin structures 204a, 204c. The uniform threshold voltage distribution along the height H of fin structures 204a, 204c results in better DC performance of the semiconductor device structure (e.g. since variation of off-state current density and on-state current density along the height H of fin structures is reduced). The present disclosure also provides methods of forming a semiconductor device structure with a uniform threshold voltage distribution along the height H of fin structures (e.g. as seen in FIGS. 2A-21A and 2B-21B). The proposed method results in less fin top loss during the manufacturing process and improved vertical fin profile tuning.

One aspect of the present disclosure involves a method that includes: forming a semiconductor liner layer on exposed surfaces of a fin structure that extends above a dielectric isolation structure disposed over a substrate; forming a first capping layer to laterally surround a bottom portion of the semiconductor liner layer; forming a second capping layer over an upper portion of the semiconductor liner layer; and annealing the fin structure having the semiconductor liner layer, the first capping layer, and the second capping layer thereon, the annealing driving a dopant from the semiconductor liner layer into the fin structure, wherein a dopant concentration profile in a bottom portion of the fin structure is different from a dopant concentration profile in an upper portion of the fin structure.

Another aspect of the present disclosure involves a method that includes: forming a fin structure including a source region, a drain region, and a channel region interposed between the source region and the drain region; processing the channel region of the fin structure such that a threshold voltage is uniform across a height of the fin structure, the processing including: forming a semiconductor liner layer including a dopant over the channel region of the fin structure; forming a first capping layer to physically contact a bottom portion of the semiconductor liner layer; forming a second capping layer to physically contact an upper portion of the semiconductor liner layer; and annealing the channel region of the fin structure having the semiconductor liner layer, the first capping layer, and the second capping layer thereon, the annealing causing the dopant of the semiconductor liner layer to diffuse into the channel region of the fin structure, wherein an average dopant concentration in a bottom portion of the channel region is different from an average dopant concentration in an upper portion of the channel region; etching the channel region of the fin structure to remove the first capping layer, the second capping layer, and the semiconductor liner layer, the etching forming a trimmed fin structure; and forming a gate structure over the channel region of the trimmed fin structure.

Yet another aspect of the present disclosure involves a semiconductor device structure that includes: a fin structure extending above a dielectric isolation structure disposed over a silicon substrate. The fin structure including a source region, a drain region; and a channel region disposed between the source region and the drain region. An average germanium concentration in a bottom region of the channel region is different from an average germanium concentration in an upper region of the channel region, and a threshold voltage of the fin structure is uniform across a height of the fin structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a fin structure extending above a dielectric isolation structure disposed over a substrate;
forming a semiconductor liner layer on exposed surfaces of the fin structure;
forming a first capping layer over the dielectric isolation structure, the first capping layer laterally surrounding a bottom portion of the semiconductor liner layer, the bottom portion of the semiconductor liner layer laterally surrounding a bottom portion of the fin structure;
forming a second capping layer over an upper portion of the semiconductor liner layer, the upper portion of the semiconductor liner layer laterally surrounding an upper portion of the fin structure; and
annealing the fin structure having the semiconductor liner layer, the first capping layer, and the second capping layer thereon to drive a dopant from the semiconductor liner layer into the fin structure, wherein a dopant concentration profile in the bottom portion of the fin structure is different from a dopant concentration profile in the upper portion of the fin structure.

2. The method of claim 1, wherein the second capping layer is a material different from the first capping layer.

3. The method of claim 1, wherein the first capping layer is a nitride-containing layer, and wherein the second capping layer is an oxide-containing layer.

4. The method of claim 3, wherein, after the annealing, a center region of the upper portion of the fin structure is free from the dopant from the semiconductor liner layer, and wherein the dopant concentration profile in the bottom portion of the fin structure is substantially uniform.

5. The method of claim 1, wherein the dopant includes germanium, and wherein the fin structure includes silicon.

6. The method of claim 5, wherein, after the annealing, the dopant concentration profile in the upper portion of the fin structure is substantially uniform, and wherein a center region of the lower portion of the fin structure is free from the dopant from the semiconductor liner layer.

7. The method of claim 1, wherein the annealing is performed at a temperature in a range from about 900 degrees Celsius to about 1100 degrees Celsius.

8. The method of claim 1, wherein the annealing is performed for a duration in a range from about 5 seconds to about 60 seconds.

9. The method of claim 1, further comprising:
after the annealing, removing the first capping layer and the second capping layer to expose the semiconductor liner layer and a top surface of the dielectric isolation structure;
trimming the fin structure to remove the semiconductor liner layer, the trimming resulting in a trimmed fin structure with substantially vertical sidewalls; and
forming a gate stack over the trimmed fin structure.

10. A method, comprising:
forming a fin structure including a source region, a drain region, and a channel region interposed between the source region and the drain region;
processing the channel region of the fin structure such that a threshold voltage is uniform across a height of the fin structure, the processing including:
forming a semiconductor liner layer including a dopant over the channel region of the fin structure;
forming a first capping layer to physically contact a bottom portion of the semiconductor liner layer;
forming a second capping layer to physically contact an upper portion of the semiconductor liner layer; and
annealing the channel region of the fin structure having the semiconductor liner layer, the first capping layer, and the second capping layer thereon, the annealing causing the dopant of the semiconductor liner layer to diffuse into the channel region of the fin structure, wherein an average dopant concentration in a bottom portion of the channel region is different from an average dopant concentration in an upper portion of the channel region;
etching the channel region of the fin structure to remove the first capping layer, the second capping layer, and the semiconductor liner layer, the etching forming a trimmed fin structure; and
forming a gate structure over the channel region of the trimmed fin structure.

11. The method of claim 10, wherein the dopant includes germanium, and wherein the fin structure includes silicon.

12. The method of claim 10, wherein the fin structure is a fin structure of a p-type transistor device.

13. The method of claim 10, wherein a difference between the average dopant concentration in the bottom portion of the channel region and the average dopant concentration in the upper portion of the channel region is in a range from about 3% to about 10%.

14. The method of claim 10, wherein the first capping layer is a nitride-containing layer, and wherein the second capping layer is an oxide-containing layer.

15. The method of claim 14, wherein, after the annealing, a core region of the upper portion of the channel region is free from the dopant, and wherein the average dopant concentration in the bottom portion of the channel region is substantially uniform.

16. The method of claim 10, wherein
the annealing is performed at a temperature in a range from about 900 degrees Celsius to about 1100 degrees Celsius, and
the annealing is performed for a duration in a range from about 5 seconds to about 60 seconds.

17. The method of claim 10, wherein, after the annealing, the average dopant concentration in the upper portion of the channel region is substantially uniform, and wherein a core region of the lower portion of the channel region is free from the dopant.

18. A method, comprising:
forming a fin structure of a first semiconductor material and extending above a dielectric isolation structure disposed over a substrate;
forming a semiconductor liner layer of a second semiconductor material on exposed surfaces of the fin structure, the second semiconductor material is different from the first semiconductor material in composition;
forming a first capping layer over the dielectric isolation structure, the first capping layer laterally surrounding a bottom portion of the semiconductor liner layer, the bottom portion of the semiconductor liner layer laterally surrounding a bottom portion of the fin structure;
forming a second capping layer over an upper portion of the semiconductor liner layer, the upper portion of the semiconductor liner layer laterally surrounding an upper portion of the fin structure and the second capping layer contacting the first capping layer;
annealing the fin structure having the semiconductor liner layer, the first capping layer, and the second capping layer thereon to drive a dopant from the semiconductor liner layer into the fin structure, wherein a dopant concentration profile in the bottom portion of the fin structure is different from a dopant concentration profile in the upper portion of the fin structure;

performing an etching process to remove the first capping layer and the second capping layer; and trimming the fin structure to remove non-activated portions of the semiconductor liner layer, the trimming resulting in a trimmed fin structure with substantially vertical sidewalls.

19. The method of claim 18, wherein the first capping layer is a nitride-containing layer, and wherein the second capping layer is an oxide-containing layer.

20. The method of claim 18, wherein, after the annealing, a center region of the upper portion of the fin structure is free from the dopant from the semiconductor liner layer; and the dopant concentration profile in the bottom portion of the fin structure is substantially uniform.

* * * * *